US012604713B2

(12) United States Patent
Peng

(10) Patent No.: US 12,604,713 B2
(45) Date of Patent: *Apr. 14, 2026

(54) METHOD OF FORMING MASK WITH REDUCED FEATURE SIZES

(71) Applicant: NANYA TECHNOLOGY CORPORATION, New Taipei City (TW)

(72) Inventor: Jung-Tzu Peng, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 233 days.

This patent is subject to a terminal disclaimer.

(21) Appl. No.: 18/511,023

(22) Filed: Nov. 16, 2023

(65) Prior Publication Data

US 2025/0069889 A1      Feb. 27, 2025

Related U.S. Application Data

(62) Division of application No. 18/238,015, filed on Aug. 25, 2023.

(51) Int. Cl.
H10P 76/40 (2026.01)
G03F 7/00 (2006.01)

(52) U.S. Cl.
CPC ...... H10P 76/4085 (2026.01); G03F 7/70466 (2013.01)

(58) Field of Classification Search
CPC ...... G03F 7/70466; G03F 1/70; G03F 7/2022; G03F 1/76; G03F 7/0002; H10D 30/62;
(Continued)

(56) References Cited

U.S. PATENT DOCUMENTS 8,729,675 B1 * 5/2014 Choi ...................... H10B 12/02
257/586
2017/0053920 A1 * 2/2017 Kim ...................... H10B 43/27
(Continued)

FOREIGN PATENT DOCUMENTS

CN       109411536 A       3/2019
CN       110504267 A       11/2019
(Continued)

OTHER PUBLICATIONS

"An inorganic anti-reflective coating for use in photolithography", Journal of Applied Physics (Year: 1993).*
(Continued)

*Primary Examiner* — Julio J Maldonado
*Assistant Examiner* — Kenneth S. Stephenson
(74) *Attorney, Agent, or Firm* — Xuan Zhang

(57) ABSTRACT

A method of manufacturing a semiconductor device is provided. The method includes: providing a substrate; forming a plurality of first mask layers over the substrate, wherein each of the first mask layers extends along a first direction; forming a plurality of second mask layers over the substrate, wherein each of the second mask layers extends along a second direction different from the first direction; patterning the plurality of second mask layers to form a cut pattern; forming a first aperture modification layer on the cut pattern to define a plurality of first openings overlapping the plurality of first mask layers along a third direction substantially orthogonal to the first direction and the second direction; patterning the plurality of first mask layers to form an active region definition pattern; and patterning the substrate to define an active region by the active region definition pattern.

10 Claims, 51 Drawing Sheets

(58) Field of Classification Search
CPC ...... H10D 84/038; H10D 89/10; H10D 1/716; H10D 30/024; H10D 30/025; H10D 30/63; H10B 12/01; H10B 12/02; H10B 12/09; H10B 12/315; H01L 21/0337; H01L 21/31144; H01L 21/3086; H01L 21/76816; H01L 21/0338; H01L 21/32139; H01L 21/0332; H01L 21/0274; H01L 21/308; H01L 21/3088; H01L 21/0335; H01L 21/31116; H01L 21/76802; H01L 21/0334; H01L 21/3081; H01L 21/311; H01L 21/76224
See application file for complete search history.

(56) References Cited

U.S. PATENT DOCUMENTS

| | | | |
|---|---|---|---|
| 2017/0256413 A1* | 9/2017 | Yoon .................... | H10B 12/315 |
| 2018/0024443 A1 | 1/2018 | Wittebrood | |
| 2021/0366719 A1 | 11/2021 | Zhou | |
| 2023/0162981 A1 | 5/2023 | Yu et al. | |

FOREIGN PATENT DOCUMENTS

| | | |
|---|---|---|
| EP | 1804282 A1 | 7/2007 |
| TW | 201417241 A | 5/2014 |
| TW | 201931440 A | 8/2019 |
| TW | 202315035 A | 4/2023 |
| TW | 202332000 A | 8/2023 |
| TW | 202333233 A | 8/2023 |

OTHER PUBLICATIONS

Office Action and Search Report mailed on May 14, 2024 related to Taiwanese Application No. 112138997.

Office Action and and the search report mailed on Aug. 13, 2025 related to Taiwanese Application No. 113112836.

Office Action mailed on Sep. 2, 2025 related to Chinese Application No. 202410485135.5.

Search report mailed on Sep. 2, 2025 related to Chinese Application No. 202410485135.5.

Summary translations of Office Actions and and the search reports mailed on Aug. 13, 2025 related to Taiwanese Application No. 113112836, and Sep. 2, 2025 related to Chinese Application No. 202410485135.5.

Office Action and and the search report mailed on Nov. 6, 2025 related to U.S. Appl. No. 18/238,015.

* cited by examiner

A'

B'

106

102

A

B

A'

A

106

102

Z

Y

X

106

102

B

B'

Z

Y

X

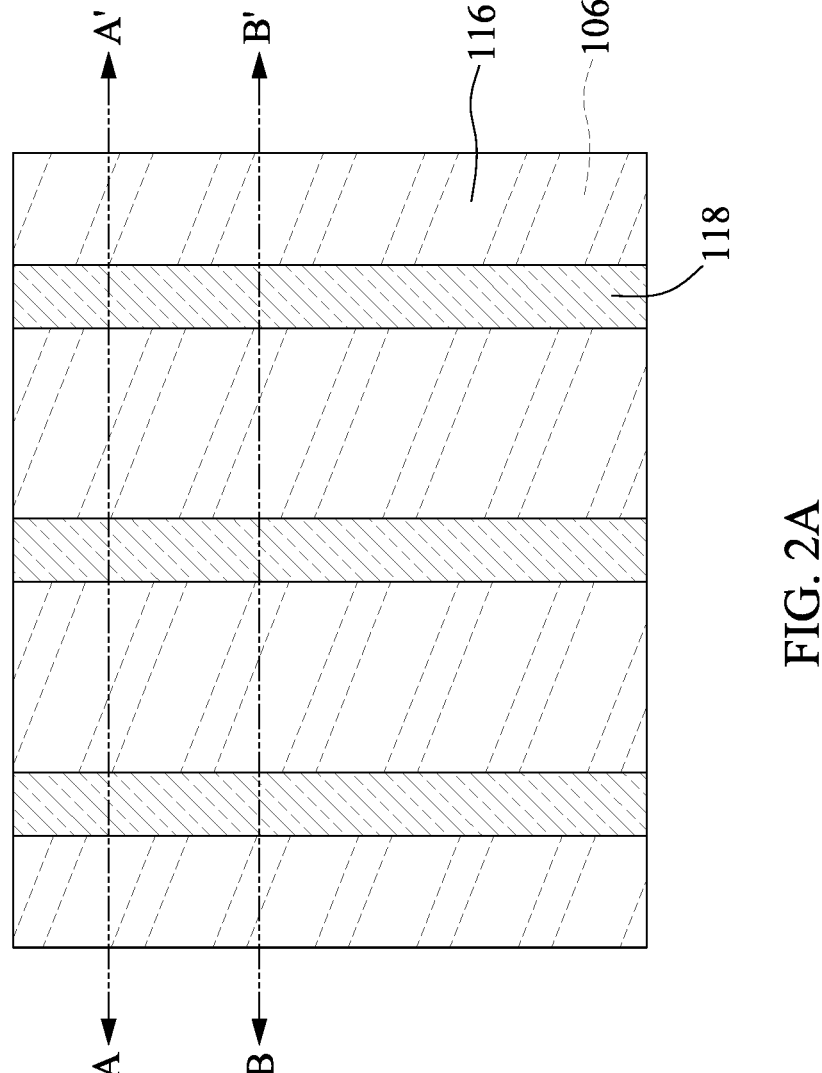
FIG. 2A
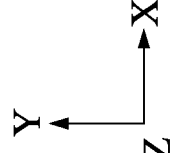

118

116

114

112

108

106

102

A

A'

X

Y

Z 118
116
114
112
108
106
102

B          B'

Z
X
Y

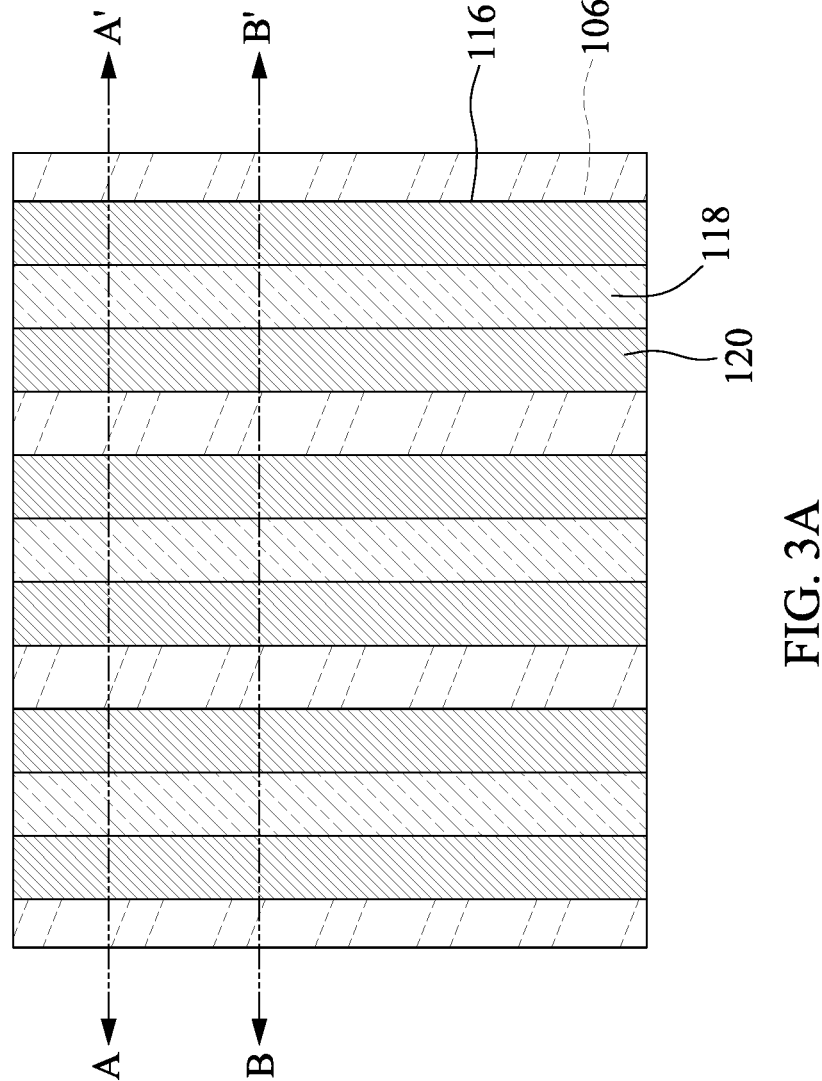
A'
B'
116
106
118
120
A
B
FIG. 3A
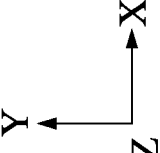

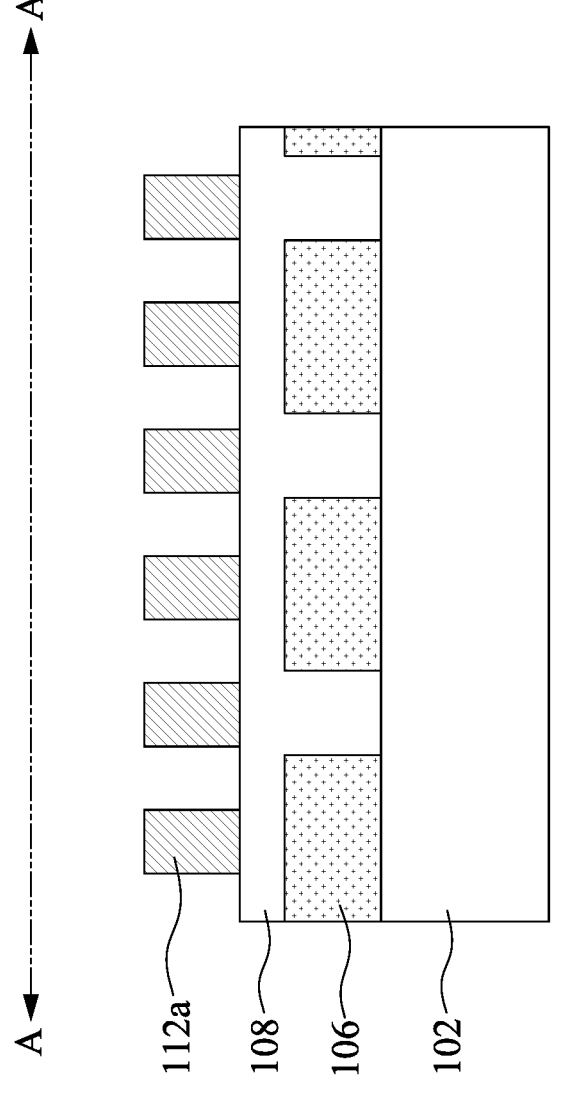
A'
A
112a
108
106
102
FIG. 4B
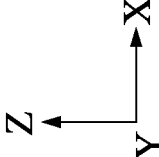
Z
X
Y

B'

B

112a

108

106

102

Z

X

Y

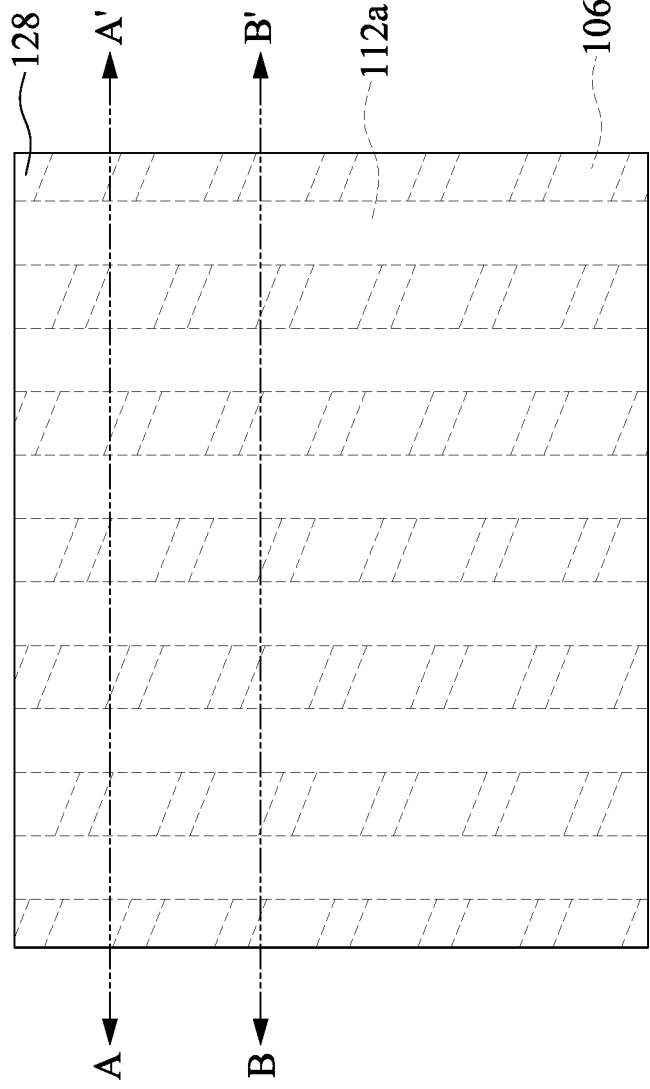
FIG. 5A
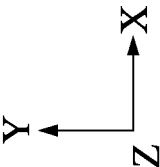

128
126
124
122
112a
108
106
102

A
A'

Z
Y
X 128
126
124
122
112a
108
106
102

B

B'

Z
X
Y

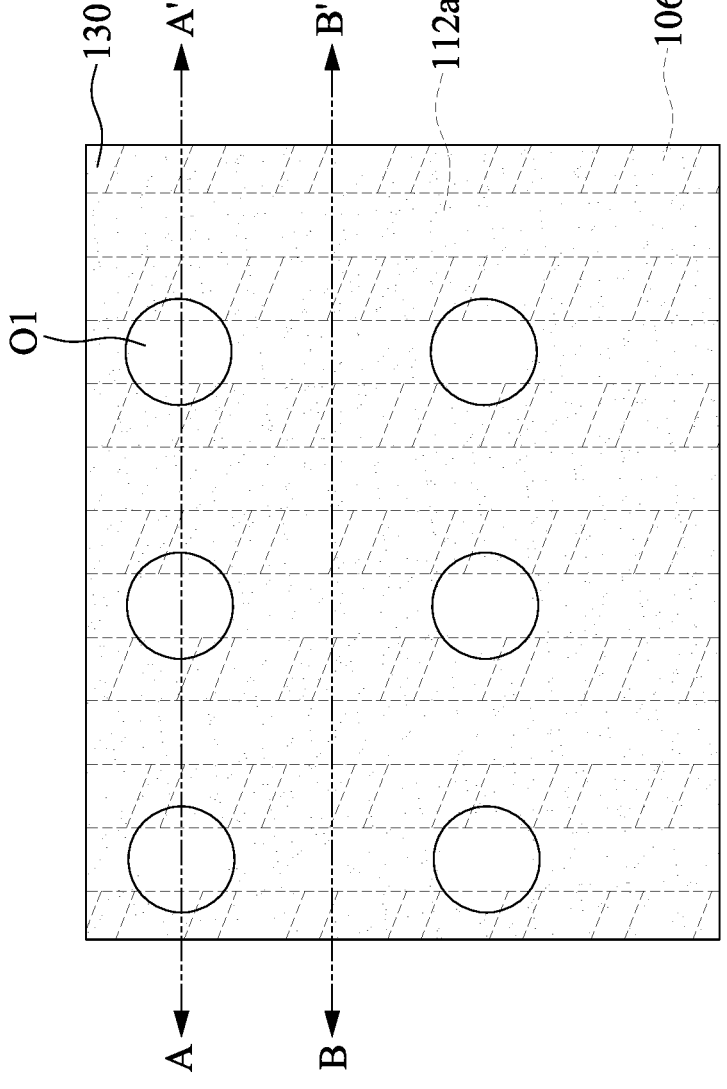
FIG. 6A
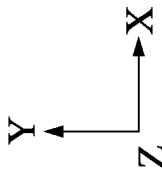

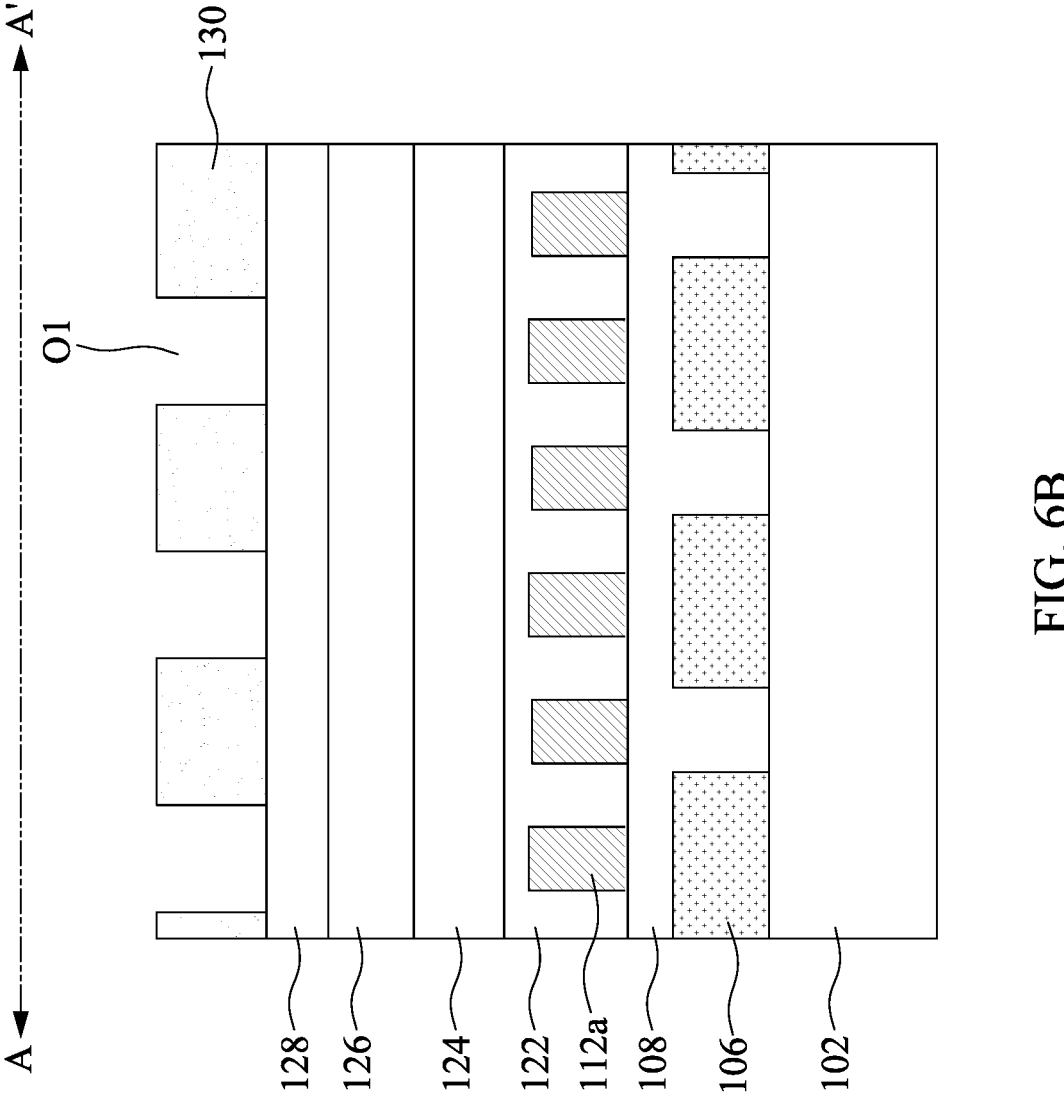
FIG. 6B
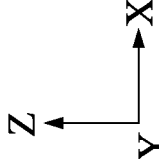

B' — 130
128
126
124
122
112a
108
106
102

B

Z
X
Y

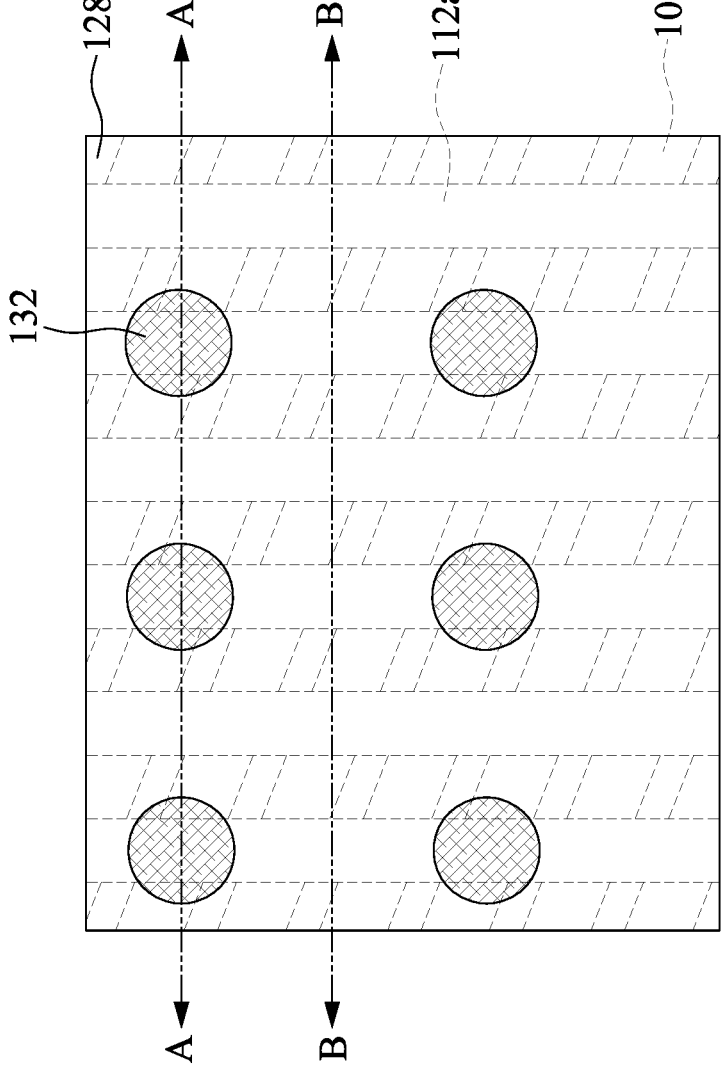
FIG. 7A
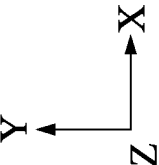

A — A'

132

128
126
124
122
112a
108
106
102

Z
Y — X

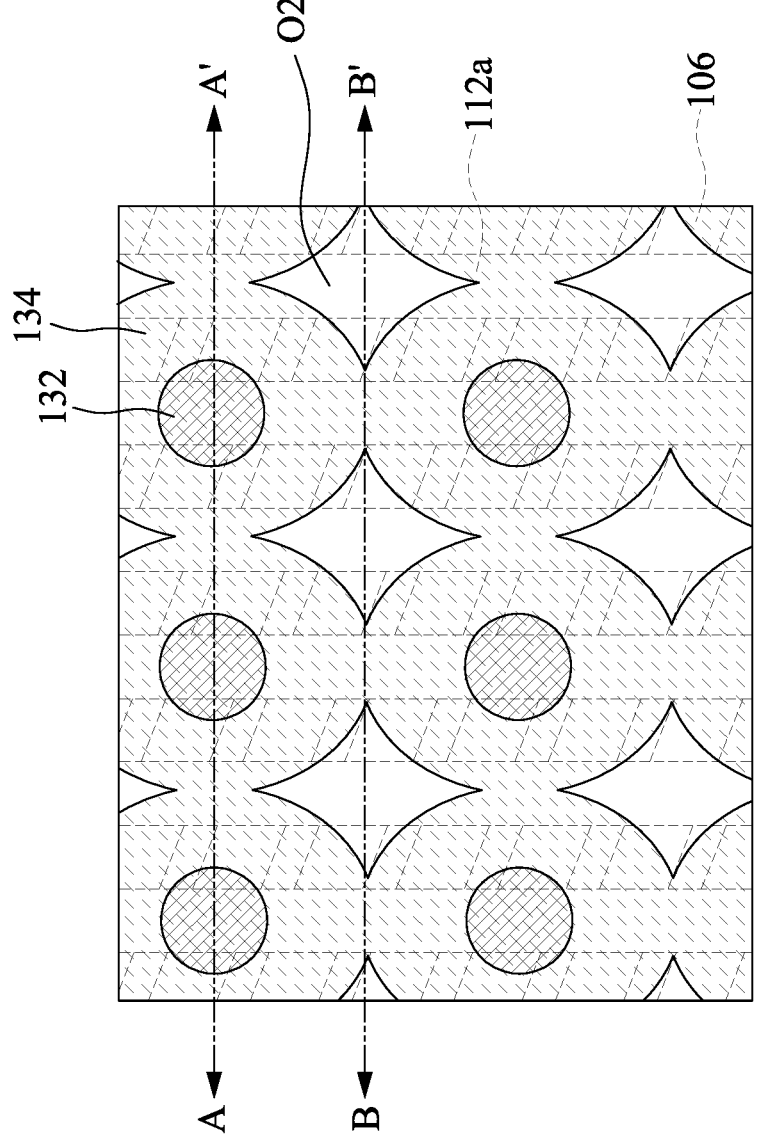
FIG. 8A
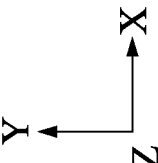

A'

134

132

128

126

124

122

112a

108

106

102

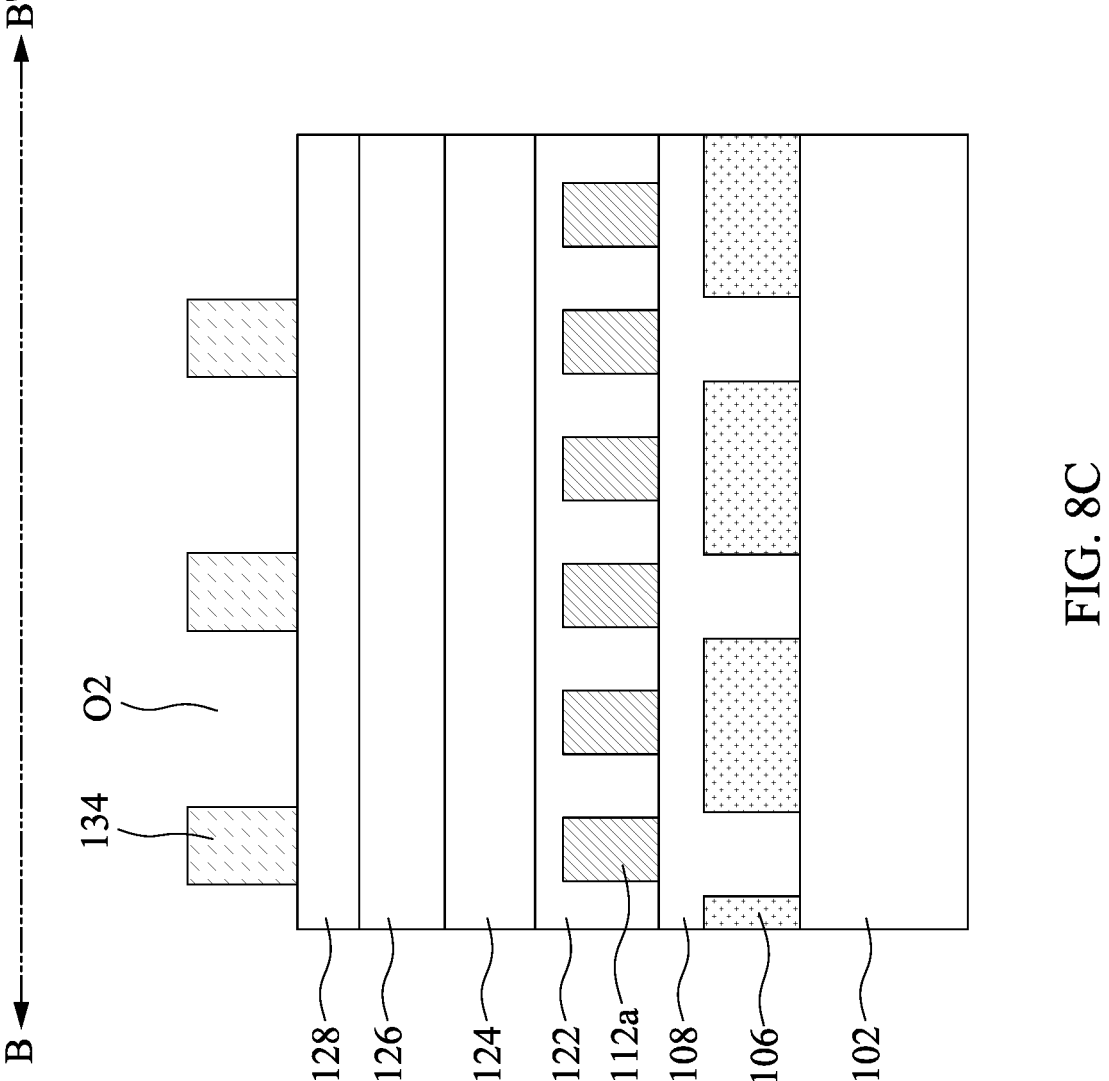
B ← - · - · - · - · - · - · - · → B'
O2
134
128
126
124
122
112a
108
106
102
FIG. 8C
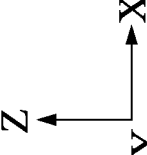
Z ← X
Y

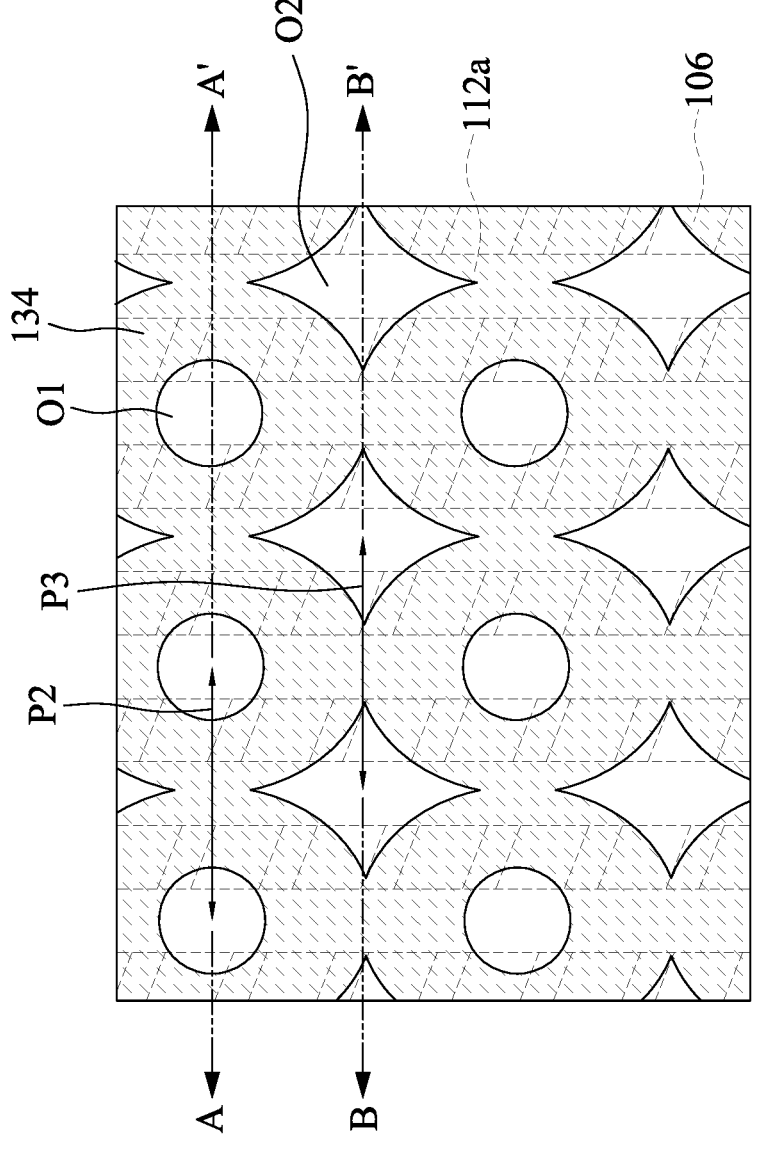
FIG. 9A
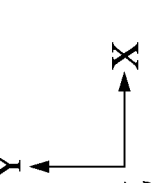

128
126
124
122
112b
108
106
102

O1'
140
134
A
A'

Z
X
Y

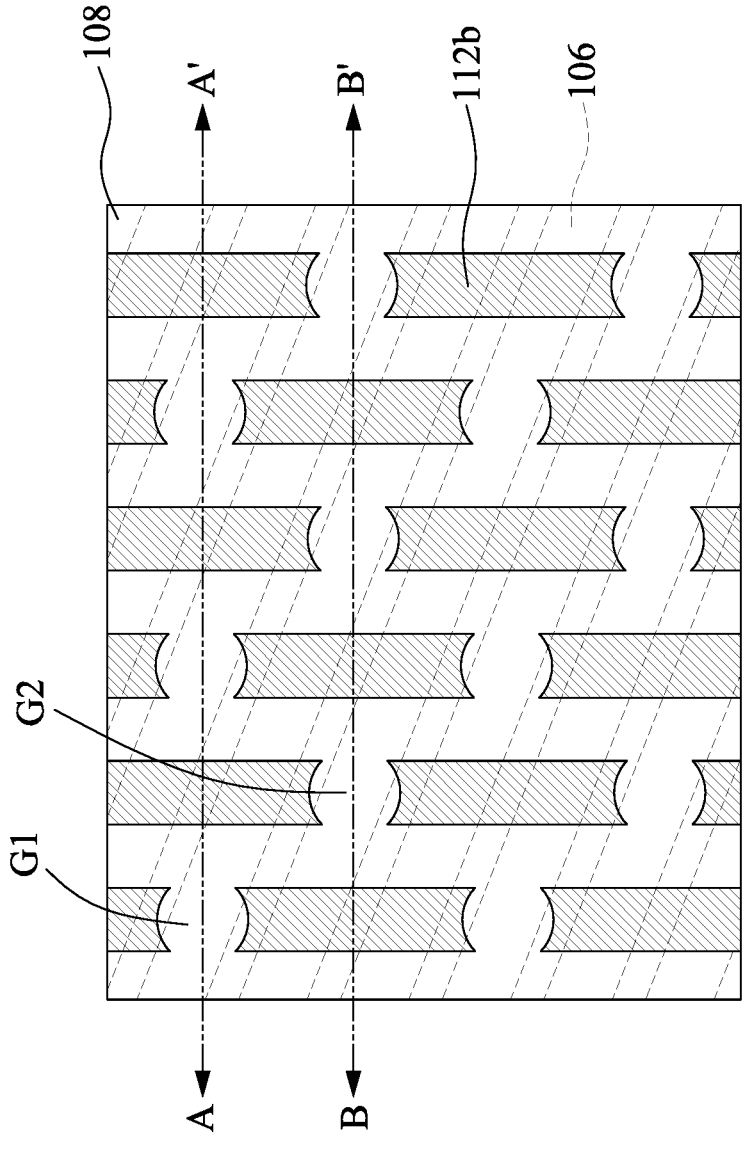
FIG. 12A
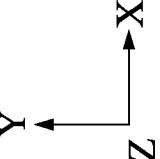

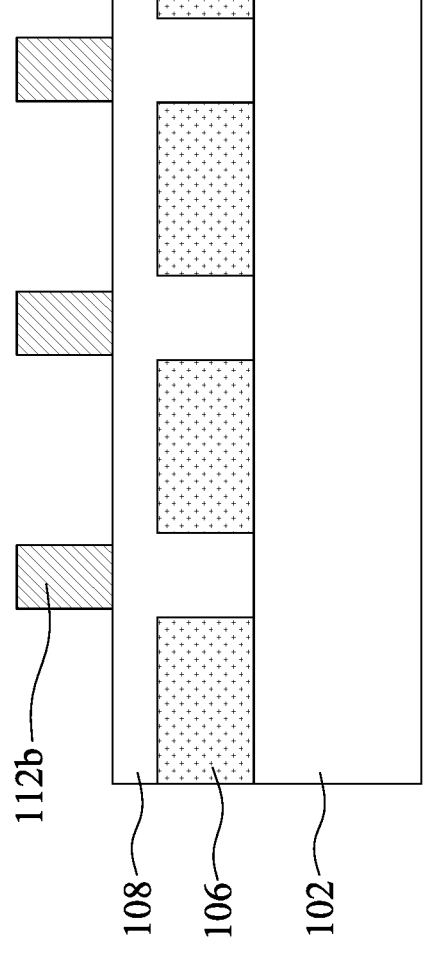
112b
108
106
102
FIG. 12B
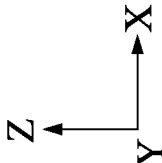

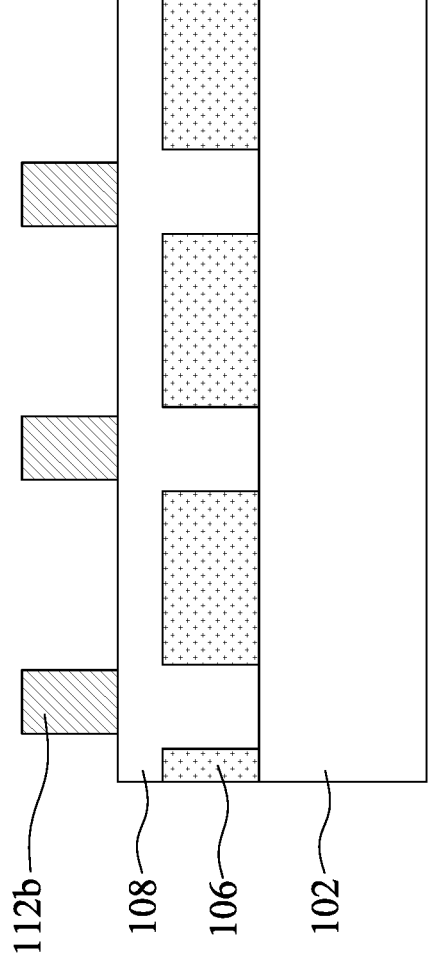
112b
108
106
102
FIG. 12C
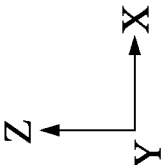
Z
X
Y

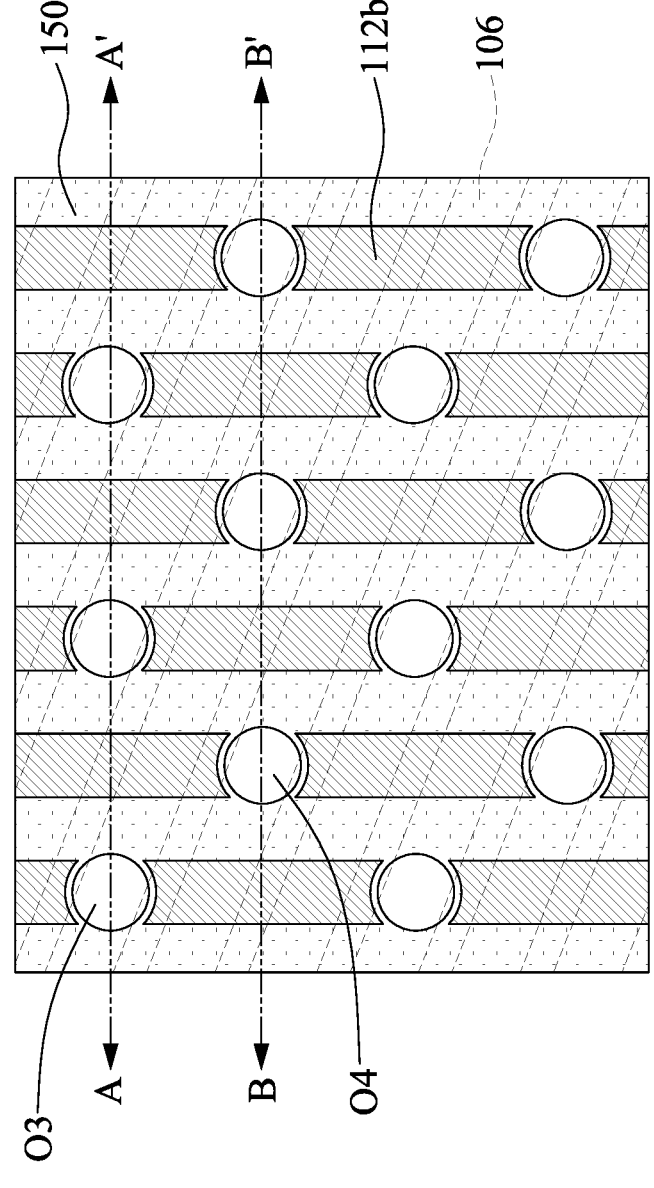
FIG. 13A
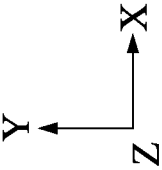

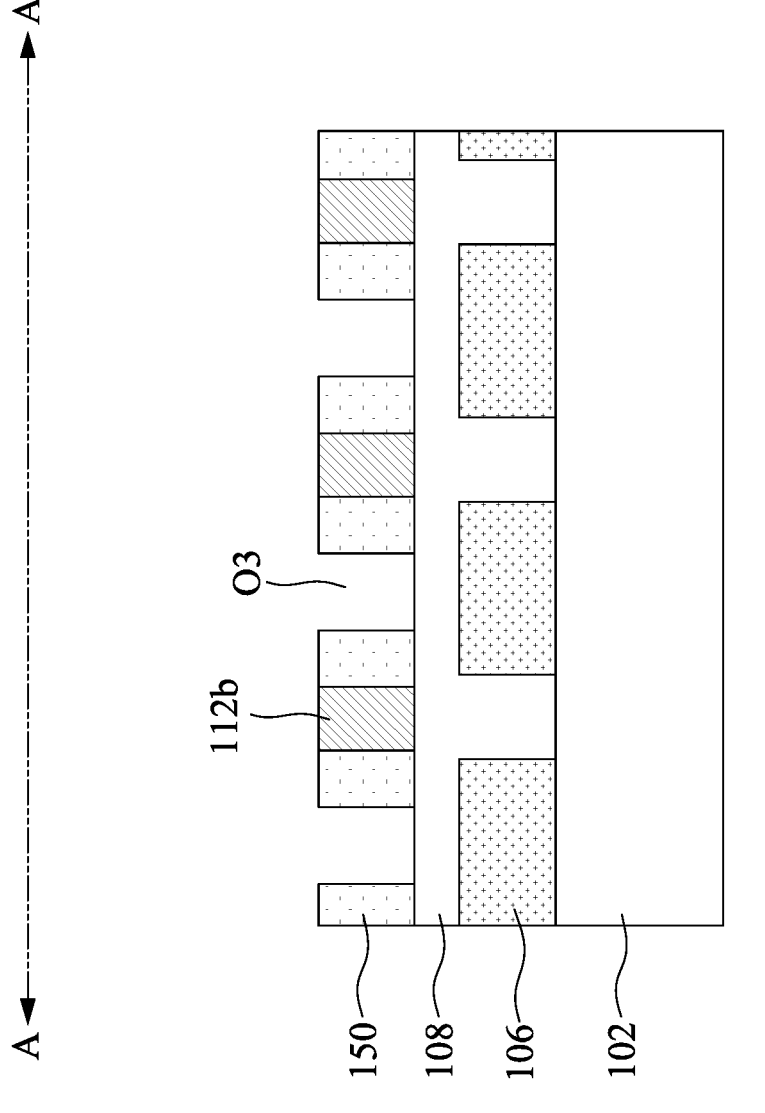
O3
112b
150
108
106
102
FIG. 13B
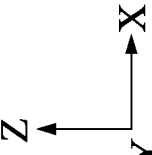
X
Z
Y

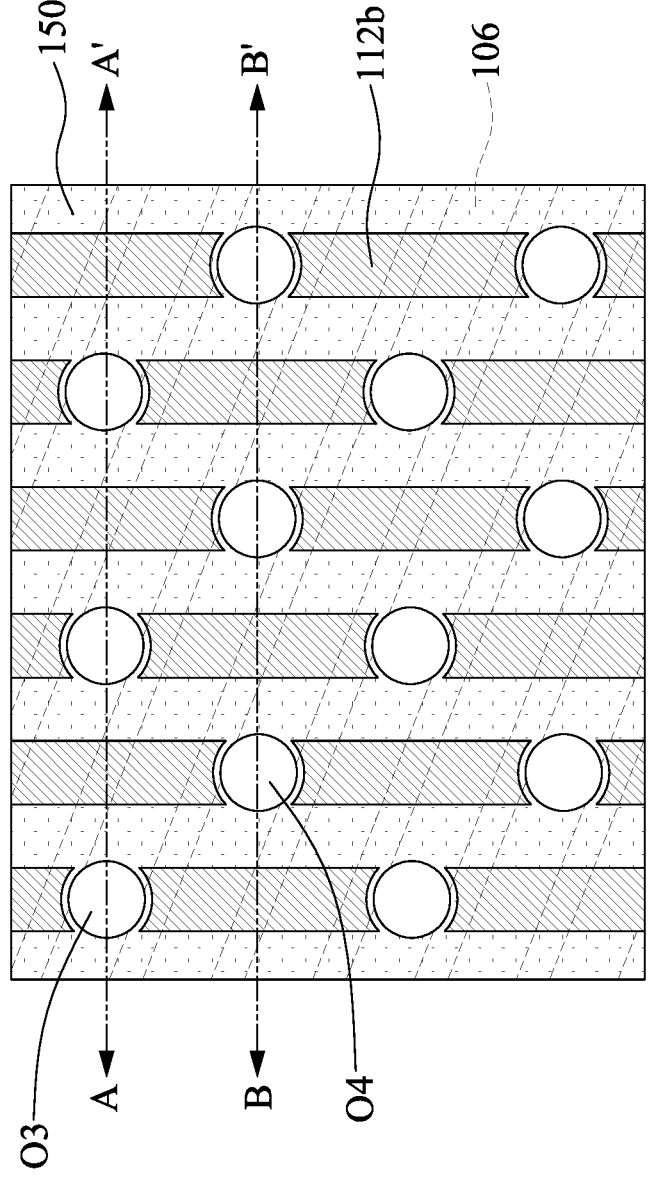
FIG. 14A
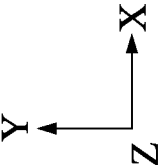

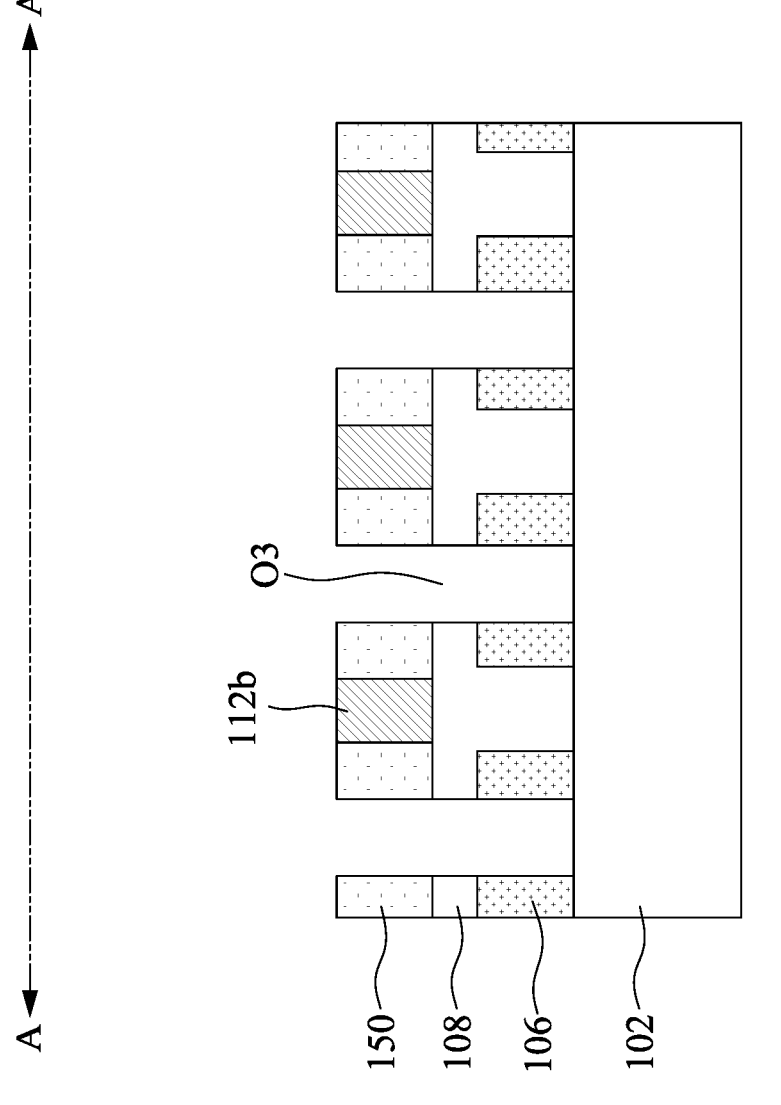
FIG. 14B
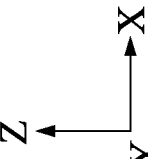

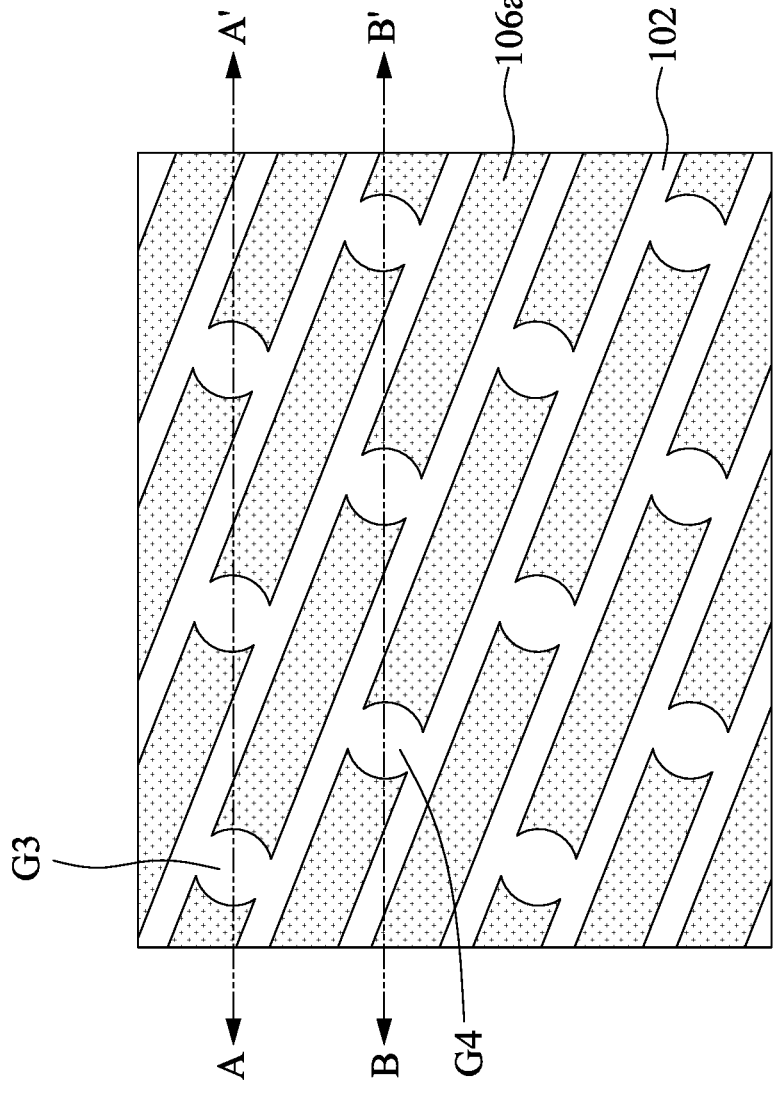
FIG. 15A
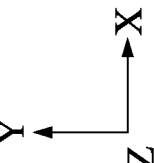

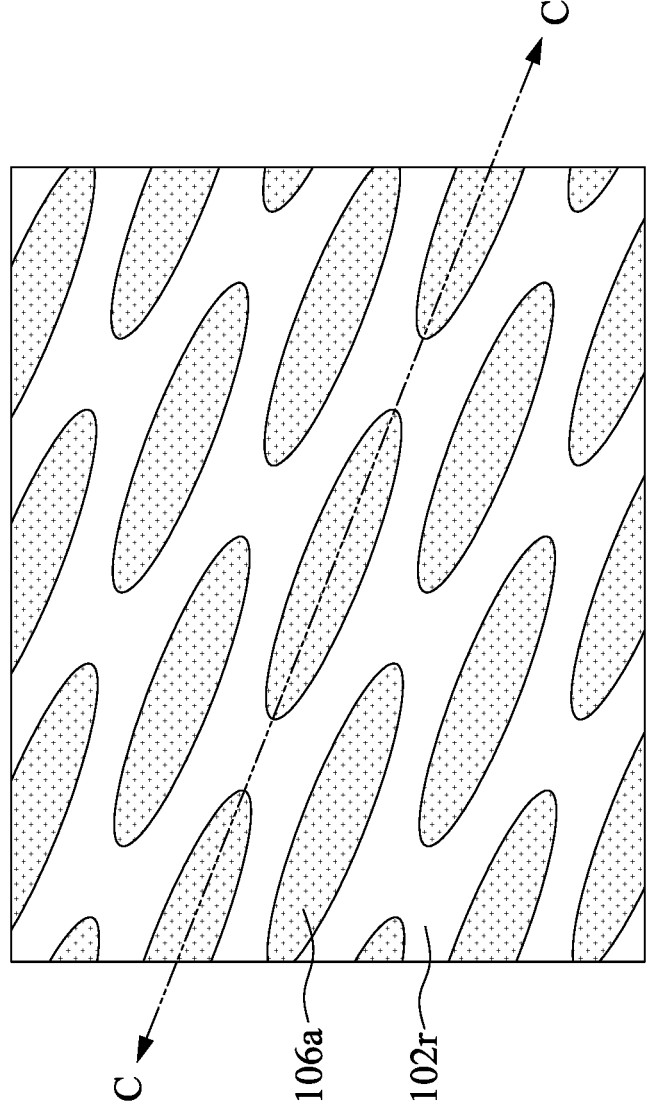
C'
C
106a
102r
FIG. 16A
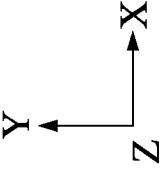
Y
X
Z

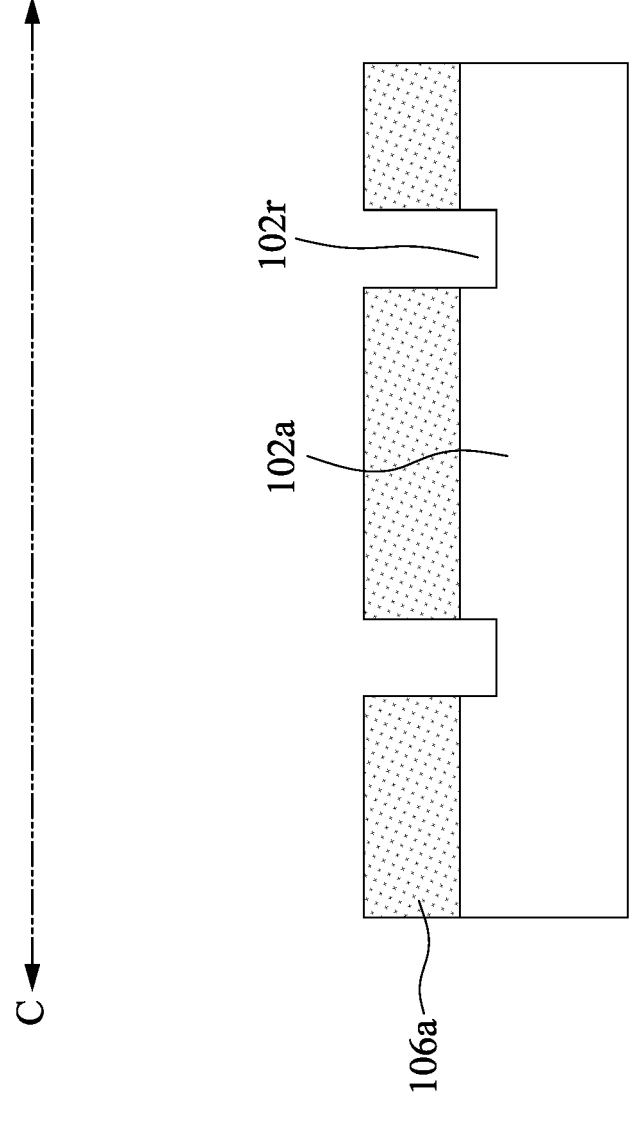
FIG. 16B
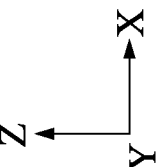

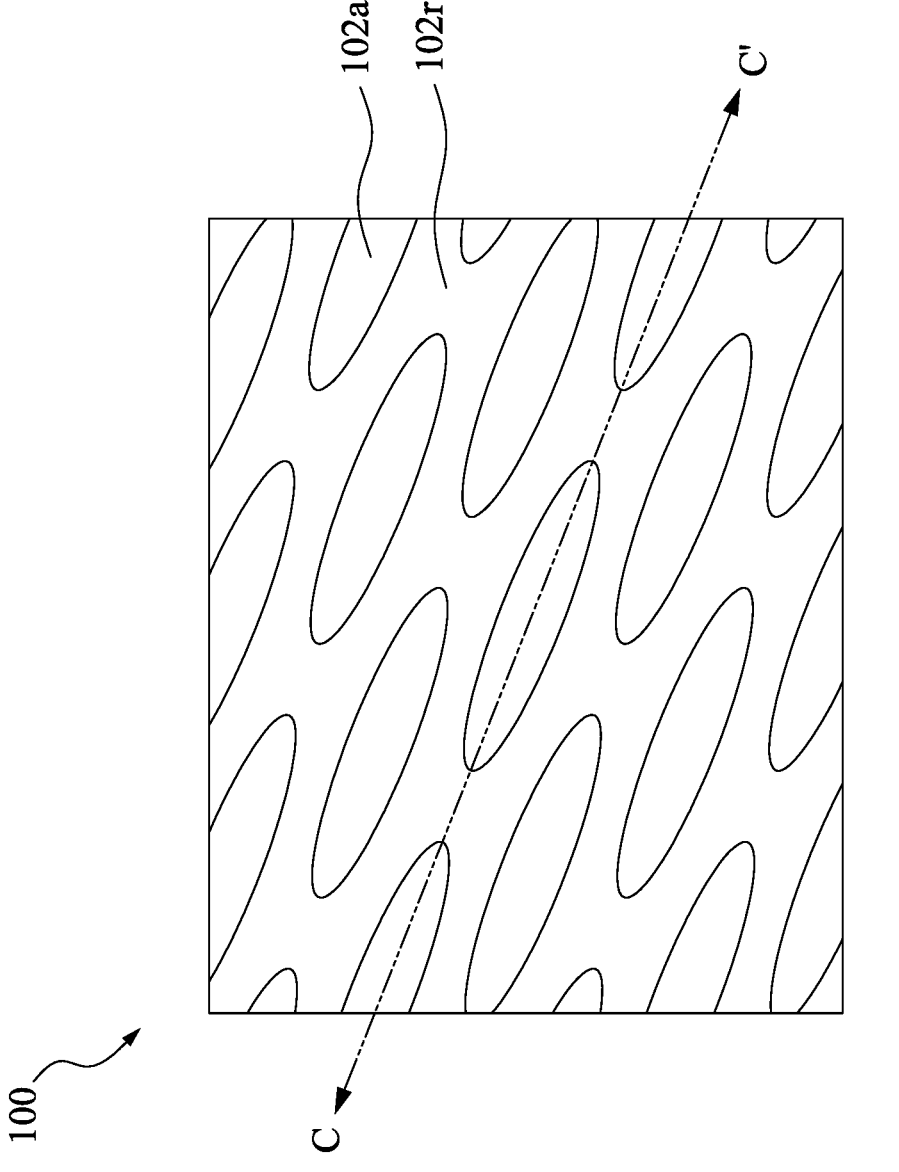
102a
102r
100
C
C'
FIG. 17A
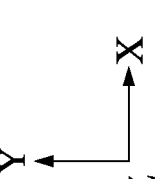

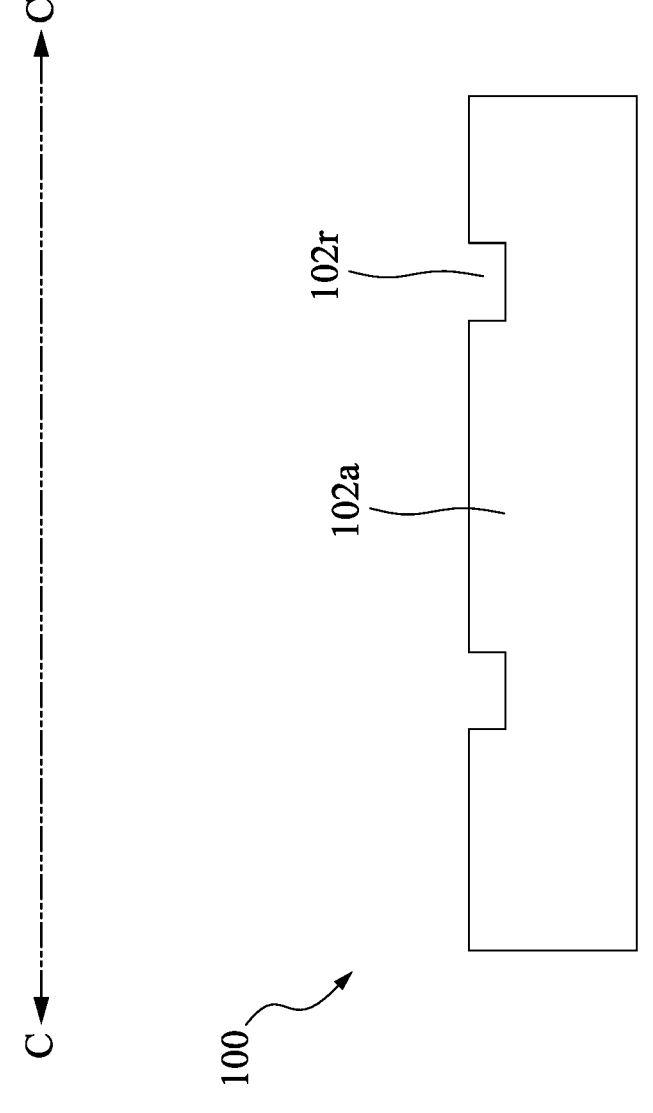
FIG. 17B
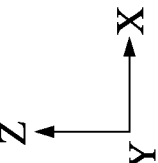

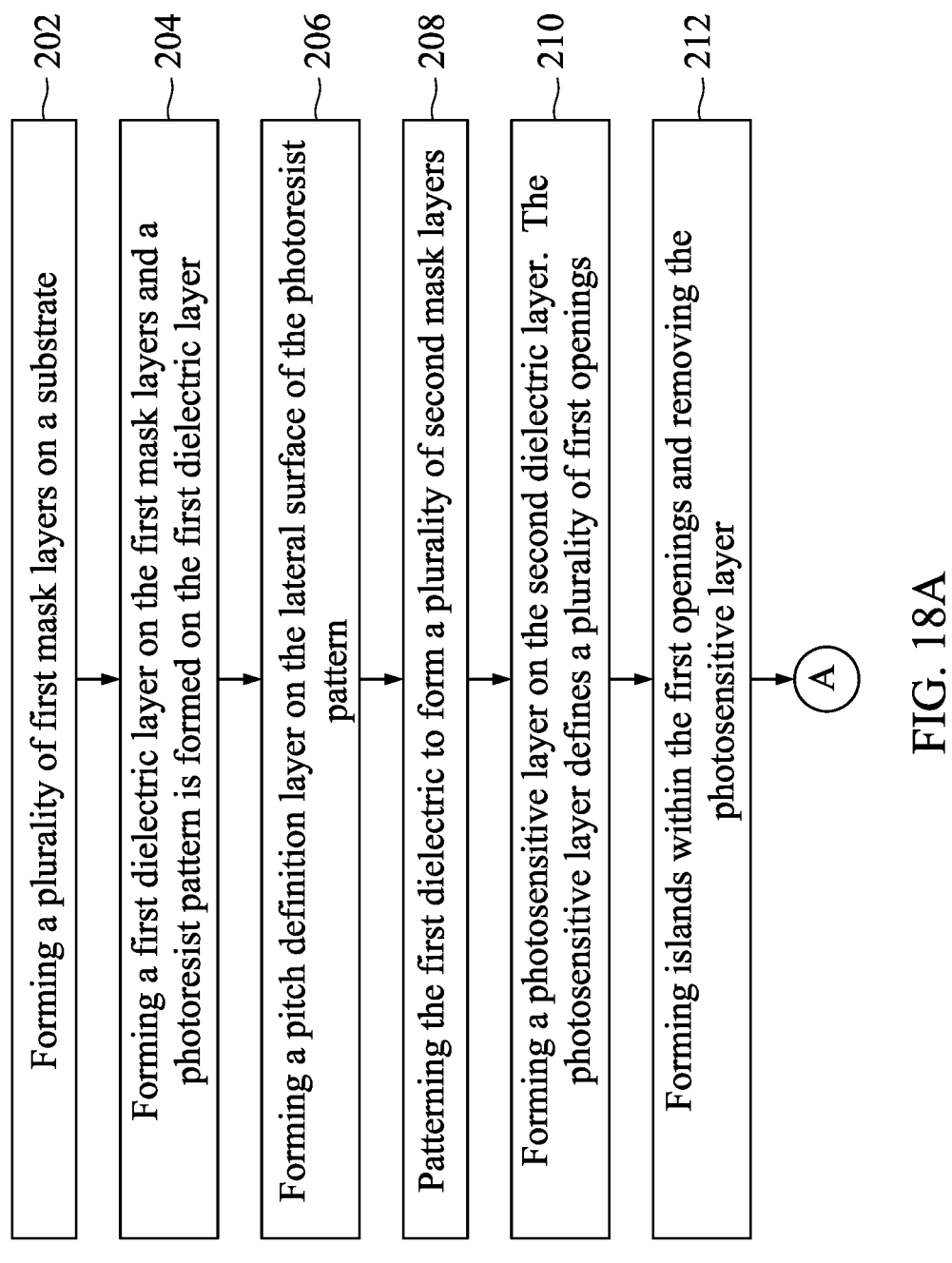

202 — Forming a plurality of first mask layers on a substrate

204 — Forming a first dielectric layer on the first mask layers and a photoresist pattern is formed on the first dielectric layer 206 — Forming a pitch definition layer on the lateral surface of the photoresist pattern 208 — Patterning the first dielectric to form a plurality of second mask layers 210 — Forming a photosensitive layer on the second dielectric layer. The photosensitive layer defines a plurality of first openings 212 — Forming islands within the first openings and removing the photosensitive layer

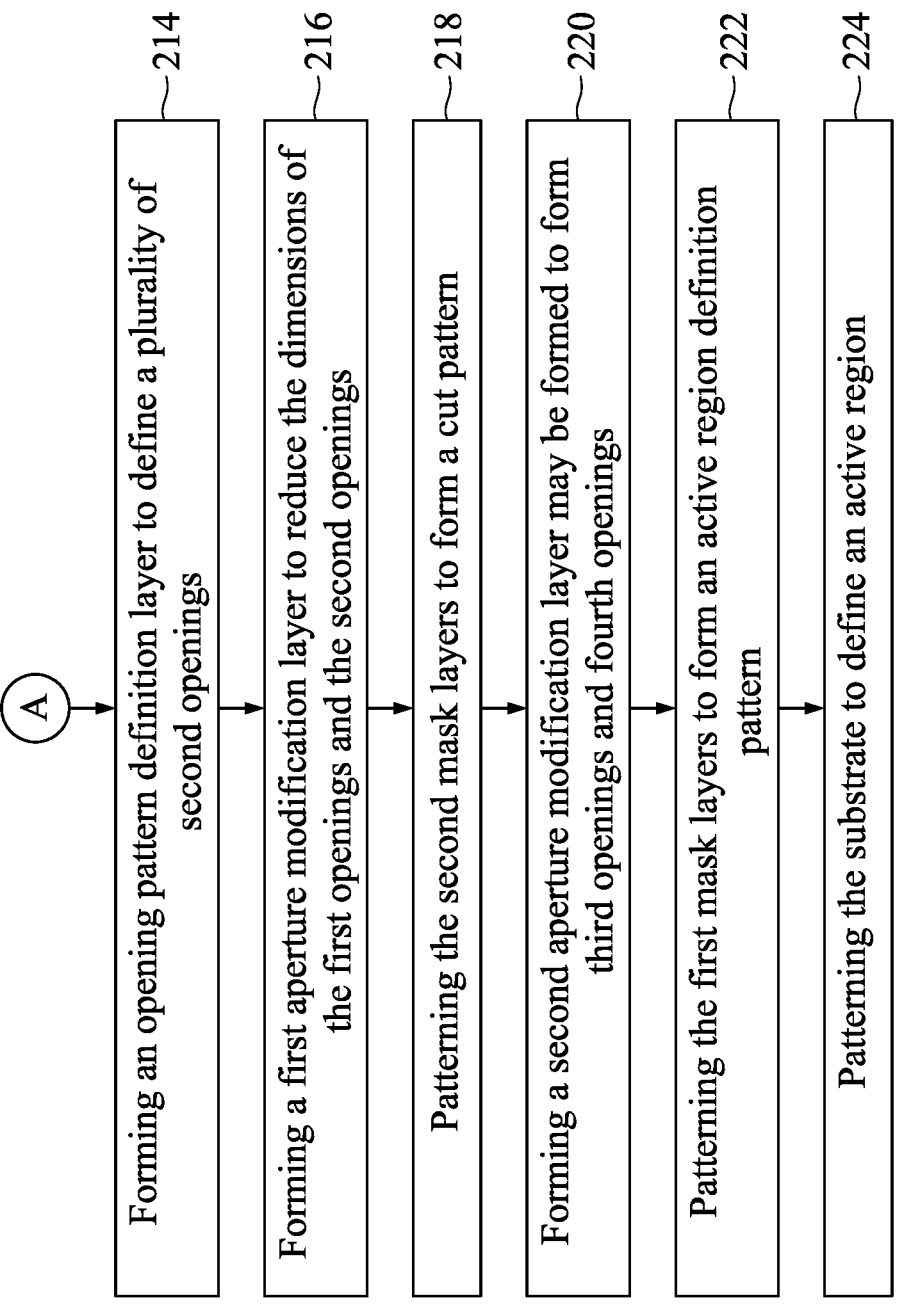

Ⓐ

Forming an opening pattern definition layer to define a plurality of second openings — 214

Forming a first aperture modification layer to reduce the dimensions of the first openings and the second openings — 216

Patterning the second mask layers to form a cut pattern — 218

Forming a second aperture modification layer may be formed to form third openings and fourth openings — 220

Patterning the first mask layers to form an active region definition pattern — 222

Patterning the substrate to define an active region — 224

FIG. 18B

METHOD OF FORMING MASK WITH REDUCED FEATURE SIZES

CROSS-REFERENCE TO RELATED APPLICATION

This application is a divisional application of U.S. Non-Provisional application Ser. No. 18/238,015 filed Aug. 25, 2023, which is incorporated herein by reference in its entirety.

TECHNICAL FIELD

The present disclosure relates to a method of manufacturing a semiconductor device, and in particularly to a method of forming an active region of a semiconductor device.

DISCUSSION OF THE BACKGROUND

With the rapid growth of the electronics industry, the development of integrated circuits (ICs) has achieved high performance and miniaturization. Technological advances in IC materials and design have produced generations of ICs where each generation has smaller and more complex circuits than the previous generation.

A Dynamic Random Access Memory (DRAM) device is a type of random access memory that stores each bit of data in a separate capacitor within an integrated circuit. Typically, a DRAM is arranged in a square array of one capacitor and transistor per cell. A vertical transistor has been developed for the $4F^2$ DRAM cell, in which F represents the photolithographic minimum feature width or critical dimension (CD). However, recently, DRAM manufacturers are facing significant challenges in minimizing memory cell area as word line spacing continues to be reduced.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a method of manufacturing a semiconductor device. The method includes: providing a substrate; forming a plurality of first mask layers over the substrate, wherein each of the first mask layers extends along a first direction; forming a plurality of second mask layers over the substrate, wherein each of the second mask layers extends along a second direction different from the first direction; patterning the plurality of second mask layers to form a cut pattern; forming a first aperture modification layer on the cut pattern to define a plurality of first openings overlapping the plurality of first mask layers along a third direction substantially orthogonal to the first direction and the second direction; patterning the plurality of first mask layers to form an active region definition pattern; and patterning the substrate to define an active region by the active region definition pattern.

Another aspect of the present disclosure provides a method of manufacturing a semiconductor device. The method includes: providing a substrate; forming a plurality of first mask layers over the substrate, wherein each of the first mask layers extends along a first direction; forming a plurality of second mask layers over the substrate, wherein each of the second mask layers extends along a second direction different from the first direction; forming a plurality of islands over the plurality of second mask layers; and forming an opening pattern definition layer on the plurality of islands to define a plurality of first openings; removing the plurality of islands to form a plurality of second openings; and forming a cut pattern by removing the plurality of second mask layers not overlapping the second openings and the third openings along a third direction orthogonal to the first direction and the second direction; patterning the plurality of first mask layers by the cut pattern; and patterning the substrate to define an active region.

Another aspect of the present disclosure provides a method for manufacturing a semiconductor device. The method includes: providing a substrate; forming a plurality of first mask layers over the substrate, wherein each of the first mask layers extends along a first direction; forming a plurality of second mask layers over the substrate, wherein each of the second mask layers extends along a second direction different from the first direction; forming an opening pattern definition layer over the plurality of second mask layers to define a plurality of openings overlapping the plurality of second mask layers along a third direction substantially orthogonal to the first direction and the second direction; forming a first aperture modification layer to modify dimensions of the plurality of openings; patterning the plurality of second mask layers to form a cut pattern by removing the plurality of second mask layers overlapping the plurality of openings; patterning the plurality of first mask layers to form an active region definition pattern; and patterning the substrate to define an active region by the active region definition pattern.

The embodiments of the present disclosure provide a method of manufacturing a semiconductor device. In this embodiment, an aperture modification layer may be formed to reduce the dimension of an opening whose aperture is defined by a lithography process. Since an aperture defined by a lithography process cannot be reduced to have a desired dimension because of equipment limitation, an aperture modification layer may be formed to reduce the dimension of the opening. As a result, the semiconductor device can have an active region with a smaller pitch, which facilitates in forming more devices in a unit area.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRA WINGS

A more complete understanding of the present disclosure may be derived by referring to the detailed description and claims when considered in connection with the Figures, where like reference numbers refer to similar elements throughout the Figures, and:

FIG. 2A illustrates one or more stages of an exemplary method for manufacturing a semiconductor device according to some embodiments of the present disclosure.

FIG. 3A illustrates one or more stages of an exemplary method for manufacturing a semiconductor device according to some embodiments of the present disclosure.

FIG. 4B is a cross-section along line A-A' of the semiconductor device as shown in FIG. 4A, in accordance with some embodiments of the present disclosure.

FIG. 5A illustrates one or more stages of an exemplary method for manufacturing a semiconductor device according to some embodiments of the present disclosure.

FIG. 6A illustrates one or more stages of an exemplary method for manufacturing a semiconductor device according to some embodiments of the present disclosure.

FIG. 6B is a cross-section along line A-A' of the semiconductor device as shown in FIG. 6A, in accordance with some embodiments of the present disclosure.

FIG. 7A illustrates one or more stages of an exemplary method for manufacturing a semiconductor device according to some embodiments of the present disclosure.

FIG. 8A illustrates one or more stages of an exemplary method for manufacturing a semiconductor device according to some embodiments of the present disclosure.

FIG. 8C is a cross-section along line B-B' of the semiconductor device as shown in FIG. 8A, in accordance with some embodiments of the present disclosure.

FIG. 9A illustrates one or more stages of an exemplary method for manufacturing a semiconductor device according to some embodiments of the present disclosure.

FIG. 12A illustrates one or more stages of an exemplary method for manufacturing a semiconductor device according to some embodiments of the present disclosure.

FIG. 12B is a cross-section along line A-A' of the semiconductor device as shown in FIG. 12A, in accordance with some embodiments of the present disclosure.

FIG. 12C is a cross-section along line B-B' of the semiconductor device as shown in FIG. 12A, in accordance with some embodiments of the present disclosure.

FIG. 13A illustrates one or more stages of an exemplary method for manufacturing a semiconductor device according to some embodiments of the present disclosure.

FIG. 13B is a cross-section along line A-A' of the semiconductor device as shown in FIG. 13A, in accordance with some embodiments of the present disclosure.

FIG. 14A illustrates one or more stages of an exemplary method for manufacturing a semiconductor device according to some embodiments of the present disclosure.

FIG. 14B is a cross-section along line A-A' of the semiconductor device as shown in FIG. 14A, in accordance with some embodiments of the present disclosure.

FIG. 15A illustrates one or more stages of an exemplary method for manufacturing a semiconductor device according to some embodiments of the present disclosure.

FIG. 16A illustrates one or more stages of an exemplary method for manufacturing a semiconductor device according to some embodiments of the present disclosure.

FIG. 16B is a cross-section along line C-C' of the semiconductor device as shown in FIG. 16A, in accordance with some embodiments of the present disclosure.

FIG. 17A illustrates one or more stages of an exemplary method for manufacturing a semiconductor device according to some embodiments of the present disclosure.

FIG. 17B is a cross-section along line C-C' of the semiconductor device as shown in FIG. 17A, in accordance with some embodiments of the present disclosure.

FIG. 18A and FIG. 18B are flowcharts illustrating a method of manufacturing a semiconductor device, in accordance with some embodiments of the present disclosure.

DETAILED DESCRIPTION

Figure 1A:
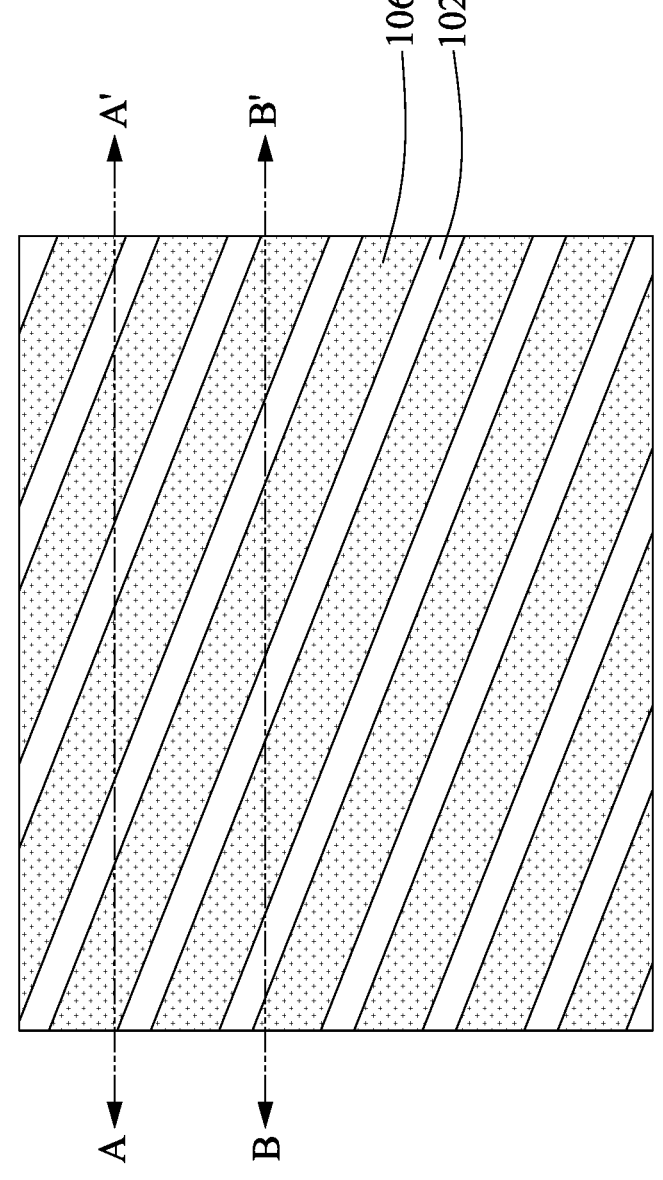
FIG. 1A illustrates one or more stages of an exemplary method for manufacturing a semiconductor device according to some embodiments of the present disclosure.
Figure 1A:
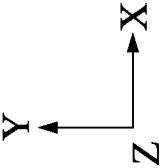

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that when an element is referred to as being "connected to" or "coupled to" another element, the initial element may be directly connected to, or coupled to, another element, or to other intervening elements.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

It should be noted that the term "about" modifying the quantity of an ingredient, component, or reactant of the present disclosure employed refers to variation in the numerical quantity that may occur, for example, through typical measuring and liquid handling procedures used for making concentrates or solutions. Furthermore, variation may occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. In yet another aspect, the term "about" means within 10, 9, 8, 7, 6, 5, 4, 3, 2, or 1% of the reported numerical value.

FIG. 1A to FIG. 17A illustrate stages of an exemplary method for manufacturing a semiconductor device according to some embodiments of the present disclosure; FIG. 1B to FIG. 15B are cross-sections along line A-A' of the semiconductor device as shown in FIG. 1A to FIG. 15A, respectively; FIG. 1C to FIG. 15C are cross-sections along line B-B' of the semiconductor device as shown in FIG. 1A to FIG. 15A, respectively; FIG. 16B and FIG. 17B are cross-sections along line C-C' of the semiconductor device as shown in FIG. 16A and FIG. 17A, respectively. It should be noted that some elements are omitted for brevity.

Figure 1B:
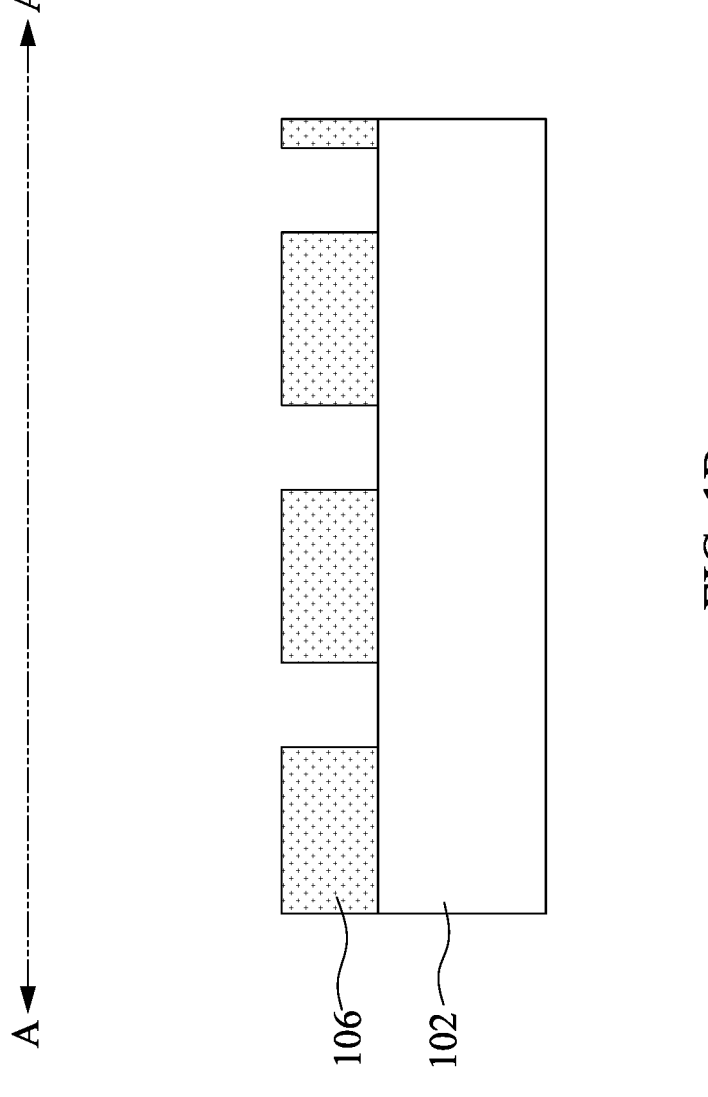
FIG. 1B is a cross-section along line A-A' of the semiconductor device as shown in FIG. 1A, in accordance with some embodiments of the present disclosure.
Figure 1C:
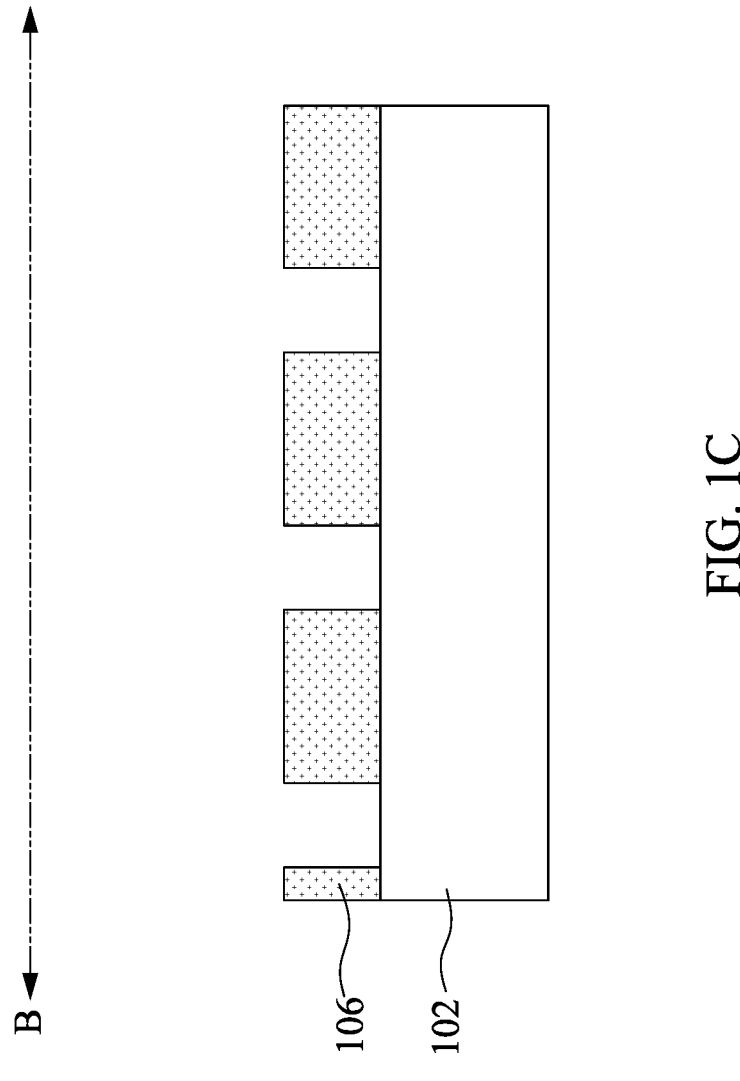
FIG. 1C is a cross-section along line B-B' of the semiconductor device as shown in FIG. 1A, in accordance with some embodiments of the present disclosure.

Referring to FIG. 1A, FIG. 1B, and FIG. 1C, a substrate 102 may be provided. The substrate 102 may be a semiconductor substrate, such as a bulk semiconductor, a semiconductor-on-insulator (SOI) substrate, or the like. The substrate 102 may include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable material; or a combination thereof. In some embodiments, the alloy semiconductor substrate may include a SiGe alloy with a gradient Ge feature in which the Si and Ge composition changes from one ratio at one location to another ratio at another location of the gradient SiGe feature. In another embodiment, the SiGe alloy is formed over a silicon substrate. In some embodiments, a SiGe alloy may be mechanically strained by another material in contact with the SiGe alloy. In some embodiments, the substrate 102 may have a multilayer structure, or the substrate 102 may include a multilayer compound semiconductor structure.

A plurality of mask layers 106 may be formed on the substrate 102. Each of the mask layers 106 may extend along a direction nonparallel to the X-direction and the Y-direction. The mask layer 106 may be configured to define an active region of the substrate 102. A portion of the substrate 102 may be exposed by the mask layer 106. The mask layer 106 may include silicon oxycarbide, silicon carbide, silicon oxide, silicon nitride, silicon carbonitride, silicon oxynitride, aluminum oxide, aluminum oxynitride, or other suitable materials. The mask layer 106 may be formed by chemical vapor deposition (CVD), atomic layer deposition (ALD), physical vapor deposition (PVD), low-pressure chemical vapor deposition (LPCVD), plasma-enhanced CVD (PECVD), or other suitable processes.

Figure 2B:
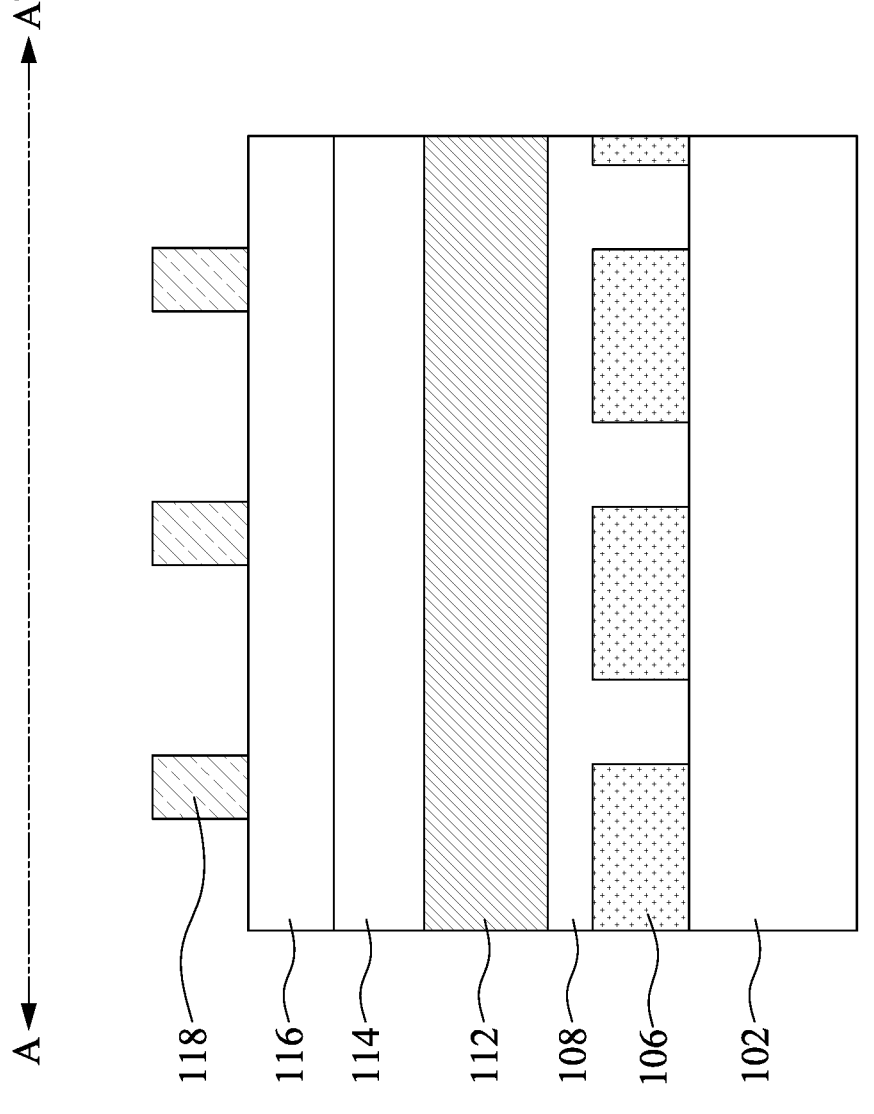
FIG. 2B is a cross-section along line A-A' of the semiconductor device as shown in FIG. 2A, in accordance with some embodiments of the present disclosure.
Figure 2C:
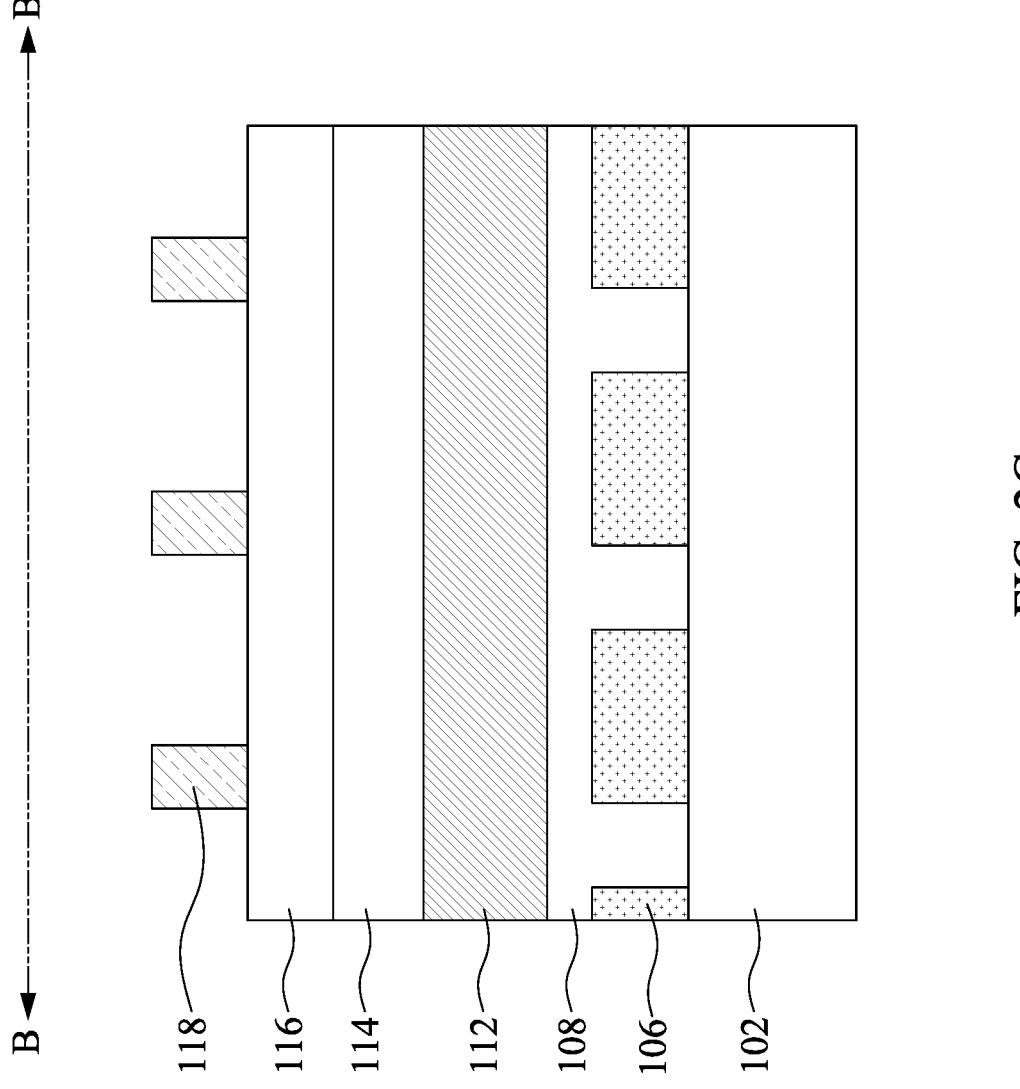
FIG. 2C is a cross-section along line B-B' of the semiconductor device as shown in FIG. 2A, in accordance with some embodiments of the present disclosure.

Referring to FIG. 2A, FIG. 2B, and FIG. 2C, an underlayer 108 may be formed over on the mask layer 106. The underlayer 108 may fill the openings defined by the mask layers 106. The underlayer 108 may include a dielectric material, such as a polymer or other suitable materials. The underlayer 108 may be formed, for example, by a spin on coating process or other suitable processes.

A dielectric layer 112 may be formed on the underlayer 108. The dielectric layer 112 may be configured to form a mask, thus defining an active region definition pattern, which will be described later. The dielectric layer 112 may include silicon oxide, silicon oxycarbide, silicon carbide, silicon nitride, silicon carbonitride, silicon oxynitride, aluminum oxide, aluminum oxynitride, or other suitable materials. The dielectric layer 112 may be formed by CVD, ALD, PVD, LPCVD, PECVD, or other suitable processes.

A dielectric layer 114 may be formed on the dielectric layer 112. The dielectric layer 114 may be configured function as a mask to define the pattern of the dielectric layer 112. In some embodiments, the dielectric layer 114 may include a carbon-containing material, such as an amorphous carbon or other suitable materials. The dielectric layer 114 may be formed by CVD, ALD, PVD, LPCVD, PECVD, or other suitable processes.

A dielectric layer 116 may be formed on the dielectric layer 114. The dielectric layer 116 may function as a dielectric anti-reflection coating (DARC). The dielectric layer 116 may include silicon oxynitride, silicon oxycarbide, silicon carbide, silicon nitride, silicon carbonitride, or suitable materials. The dielectric layer 116 may be formed by CVD, ALD, PVD, LPCVD, PECVD, spin on coating or other suitable processes.

A photosensitive layer 118 (or a photoresist pattern) may be formed on the dielectric layer 116. The photosensitive layer 116 may extend along the Y-direction. The photosensitive layer 116 may include a photoresist or other suitable materials.

Figure 3B:
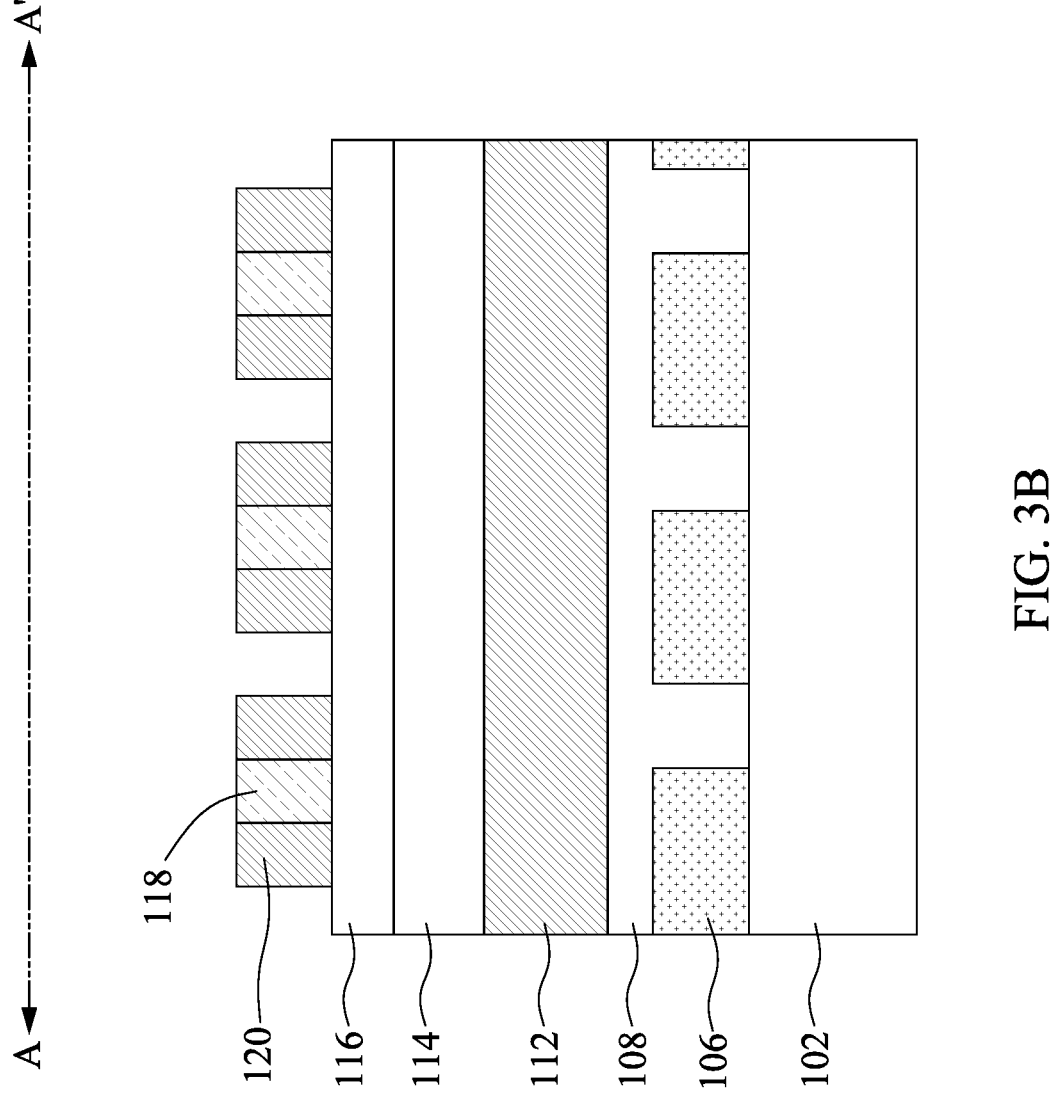
FIG. 3B is a cross-section along line A-A' of the semiconductor device as shown in FIG. 3A, in accordance with some embodiments of the present disclosure.
Figure 3C:
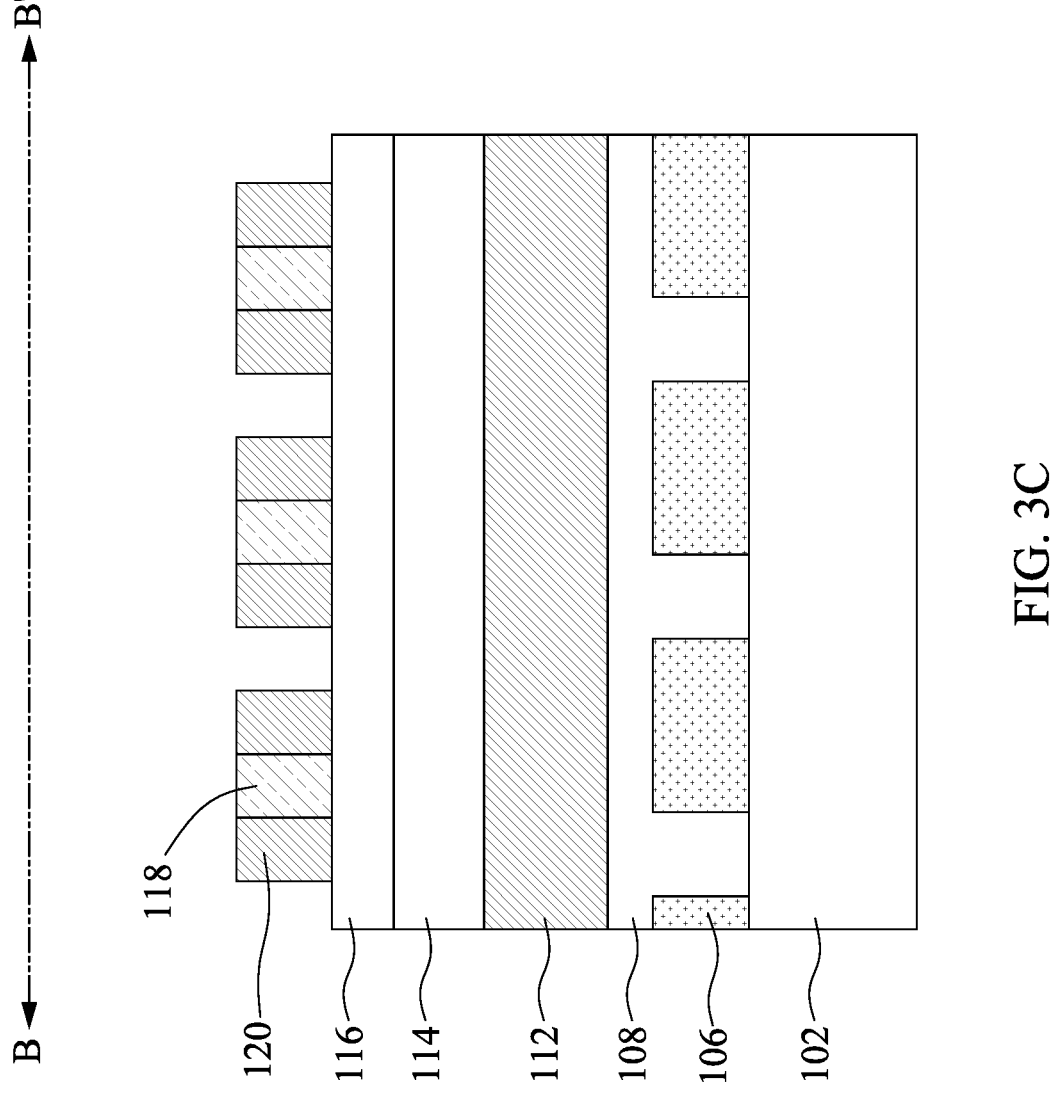
FIG. 3C is a cross-section along line B-B' of the semiconductor device as shown in FIG. 3A, in accordance with some embodiments of the present disclosure.

Referring to FIG. 3A, FIG. 3B, and FIG. 3C, a pitch definition layer 120 may be formed on the dielectric layer 116 and on the lateral surfaces (not annotated) of the photosensitive layer 118. Each of the segments of the pitch definition layer 120 may extend along the Y-direction. The pitch definition layer 120 may include silicon oxynitride, silicon oxycarbide, silicon carbide, silicon nitride, silicon carbonitride, or suitable materials. The pitch definition layer 120 may be formed by CVD, ALD, PVD, LPCVD, PECVD, spin on coating or other suitable processes.

A portion of the dielectric layer 112 may be exposed by the photosensitive layer 118 and the pitch definition layer 120. The portion of the dielectric layer 112 may be free from vertically overlapping the photosensitive layer 118 and the pitch definition layer 120 along the Z direction. In some embodiments, after the pitch definition layer 120 is formed, the photosensitive layer 118 may be removed.

Figure 4A:
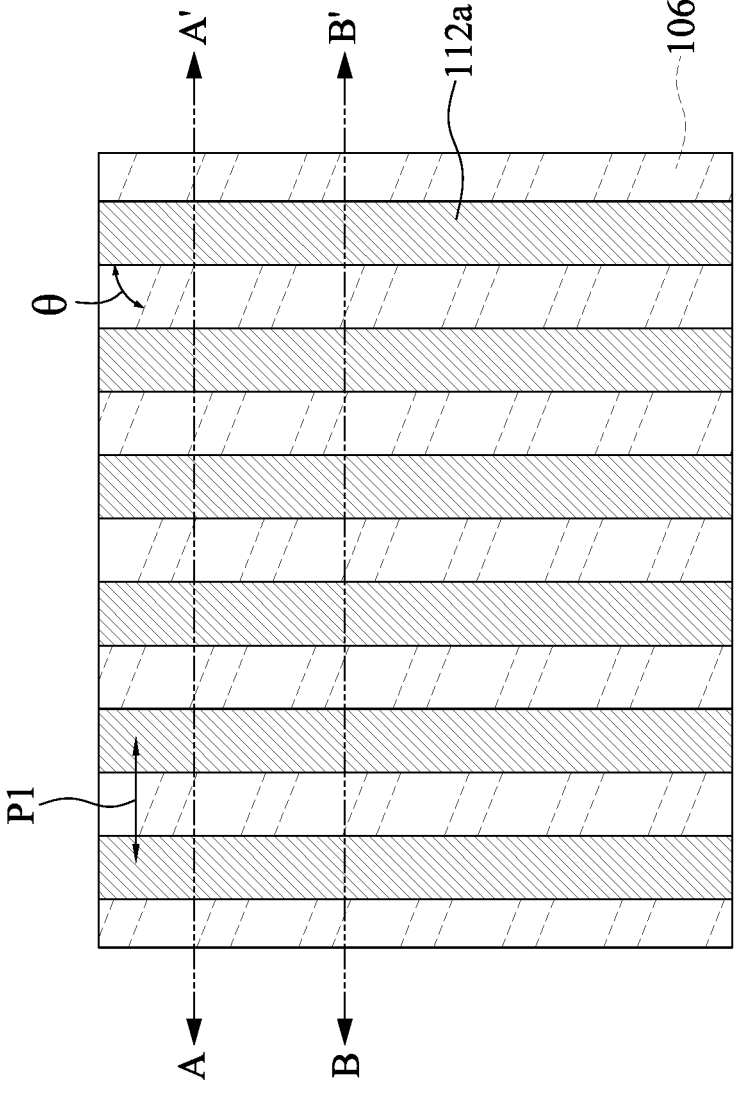
FIG. 4A illustrates one or more stages of an exemplary method for manufacturing a semiconductor device according to some embodiments of the present disclosure.
Figure 4A:
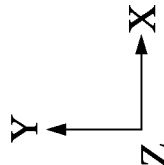
Figure 4C:
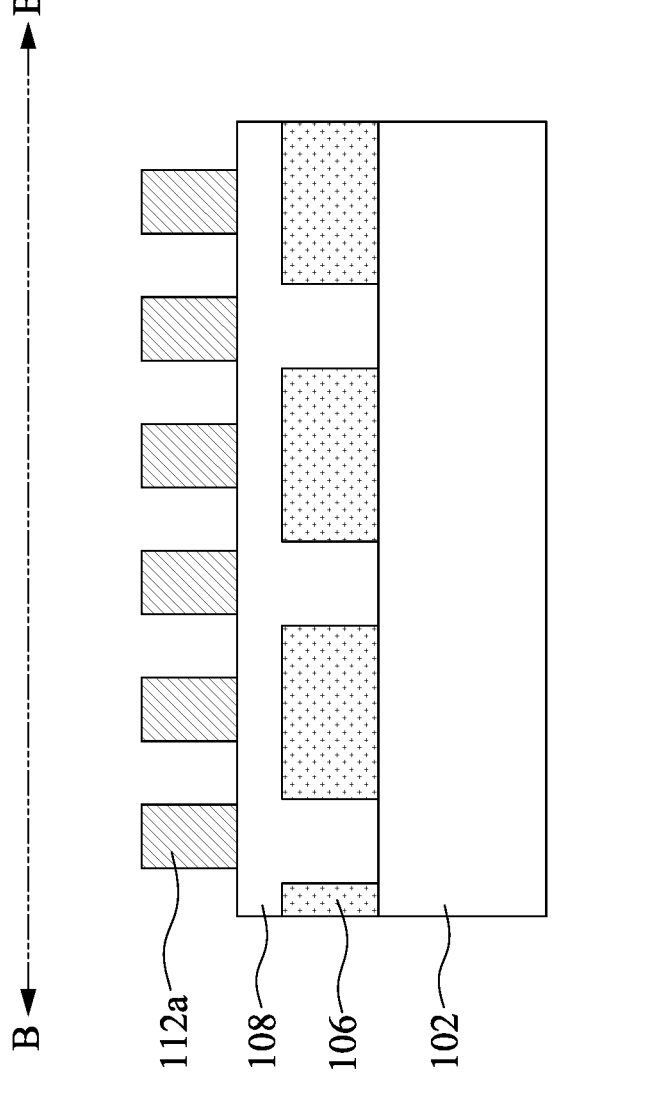
FIG. 4C is a cross-section along line B-B' of the semiconductor device as shown in FIG. 4A, in accordance with some embodiments of the present disclosure.

Referring to FIG. 4A, FIG. 4B, and FIG. 4C, the dielectric layer 112 may be patterned to form mask layers 112a. The portion of the dielectric layer 112 that is free from overlapping the pitch definition layer 120 may be removed. Next, the dielectric layer 114, the dielectric layer 116, and the pitch definition layer 120 may be removed. In some embodiments, the mask layers 112a may be formed by a self-aligning double patterning (SADP) process.

In some embodiments, the extending direction of the mask layer 112a and the extending direction of the mask layer 106 may define an angle θ in a top view. In some embodiments, the angle θ may range from about 20° to about 35°, such as 20°, 22°, 24°, 26°, 28°, 30°, 33°, or 35°.

In some embodiments, the width of the mask layer 112a may be defined by the pitch definition layer 120. In some embodiments, the pitch P1 of the mask layers 112a may be defined by the pitch definition layer 120. In some embodiments, the width of the pitch definition layer 120 may be controlled to determine the thickness of the mask layer 112a.

Figure 5B:
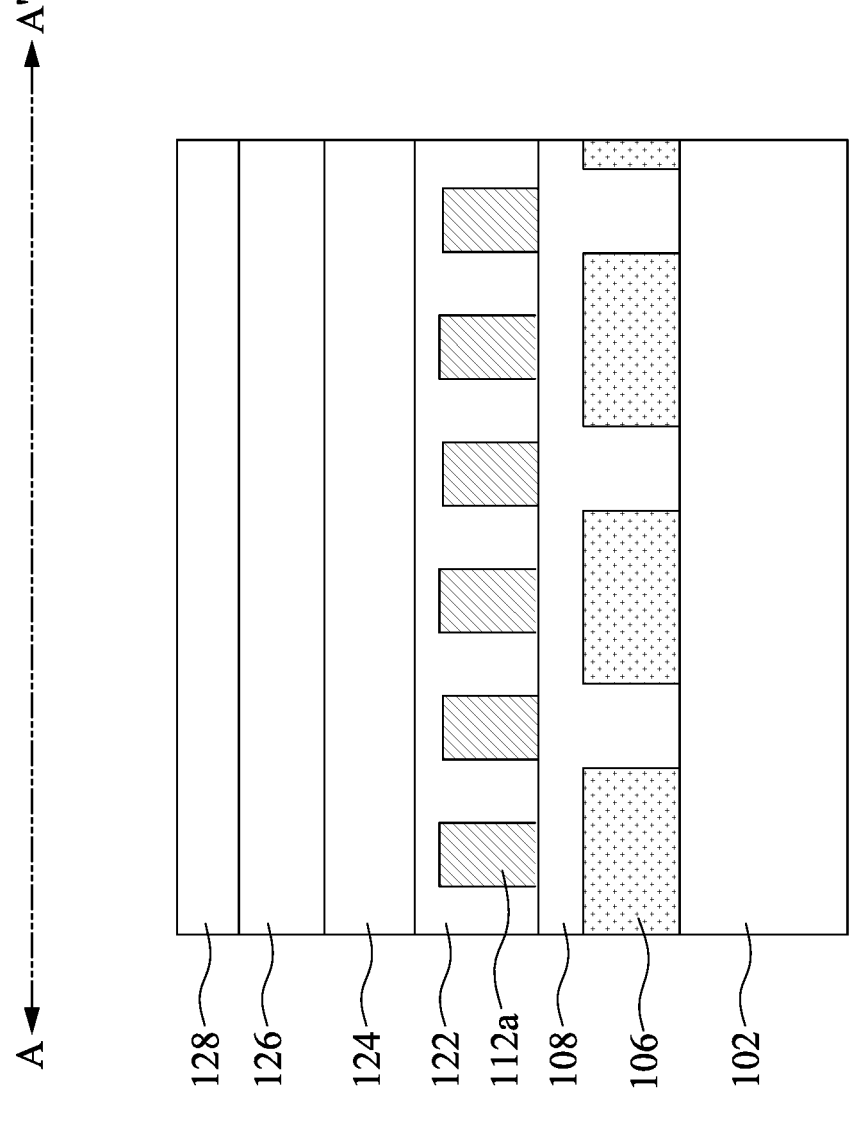
FIG. 5B is a cross-section along line A-A' of the semiconductor device as shown in FIG. 5A, in accordance with some embodiments of the present disclosure.
Figure 5C:
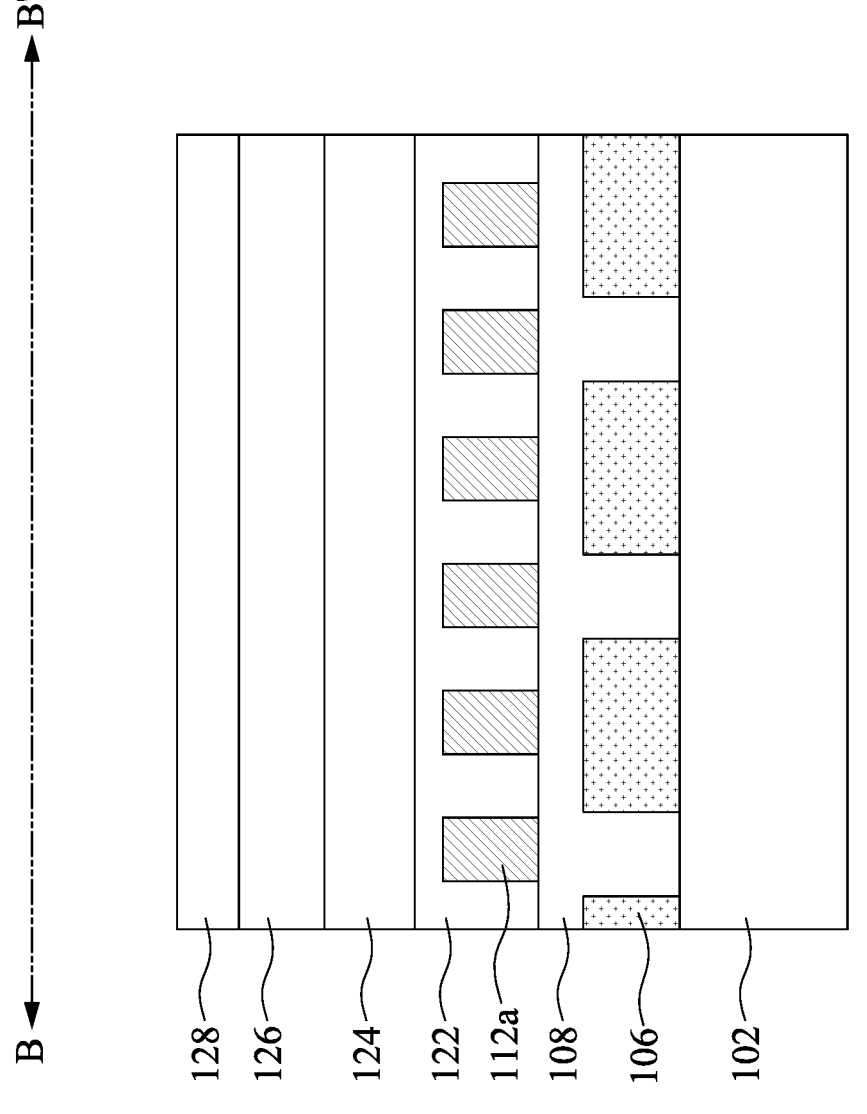
FIG. 5C is a cross-section along line B-B' of the semiconductor device as shown in FIG. 5A, in accordance with some embodiments of the present disclosure.

Referring to FIG. 5A, FIG. 5B, and FIG. 5C, an underlayer 122 may be formed over on the underlayer 108. The underlayer 122 may fill the openings defined by the mask layers 112a. The underlayer 122 may include a dielectric material, such as a polymer or other suitable materials. The underlayer 122 may be formed, for example, by a spin on coating process or other suitable processes.

A dielectric layer 124 may be formed on the underlayer 122. The dielectric layer 124 may include silicon oxide, silicon oxycarbide, silicon carbide, silicon nitride, silicon carbonitride, silicon oxynitride, aluminum oxide, aluminum oxynitride, or other suitable materials. The dielectric layer 124 may be formed by CVD, ALD, PVD, LPCVD, PECVD, or other suitable processes.

A dielectric layer 126 may be formed on the dielectric layer 124. The dielectric layer 126 may be configured function as a mask to define the pattern of the dielectric layer 124. In some embodiments, the dielectric layer 126 may include a carbon-containing material, such as an amorphous carbon. The dielectric layer 126 may be formed by CVD, ALD, PVD, LPCVD, PECVD, or other suitable processes.

A dielectric layer 128 may be formed on the dielectric layer 126. The dielectric layer 128 may function as a dielectric anti-reflection coating (DARC). The dielectric layer 128 may include silicon oxynitride, silicon oxycarbide, silicon carbide, silicon nitride, silicon carbonitride, or suitable materials. The dielectric layer 128 may be formed by CVD, ALD, PVD, LPCVD, PECVD, spin on coating or other suitable processes.

Figure 6C:
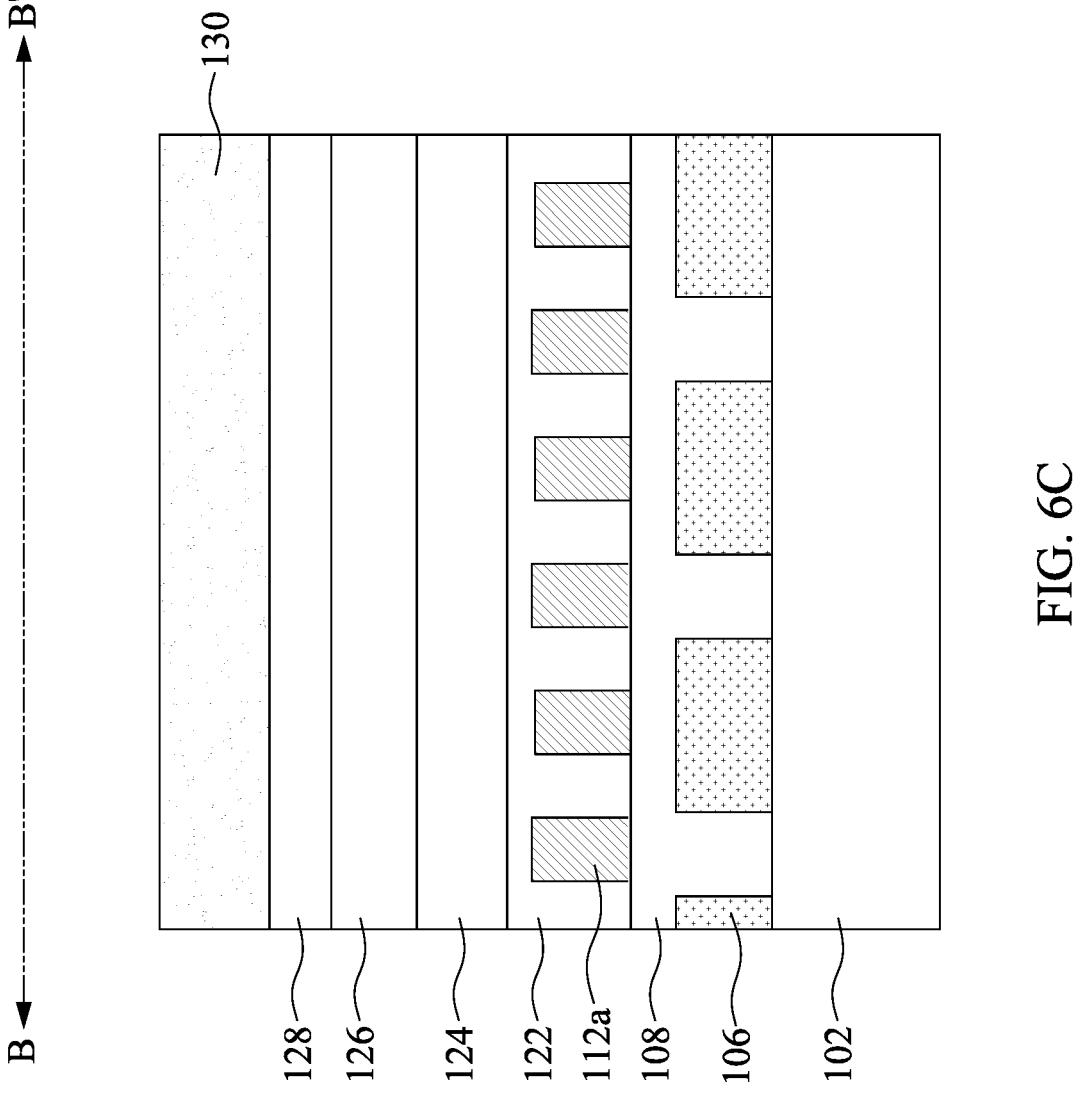
FIG. 6C is a cross-section along line B-B' of the semiconductor device as shown in FIG. 6A, in accordance with some embodiments of the present disclosure.

Referring to FIG. 6A, FIG. 6B, and FIG. 6C, a photosensitive layer 130 (or a photoresist pattern) may be formed on the dielectric layer 128. The photosensitive layer 130 may define a plurality of openings O1. The opening O1 may expose a portion of the dielectric layer 128. The photosensitive layer 130 may include a photoresist or other suitable materials. The opening O1 may include a circular profile, an elliptical profile, or other suitable profiles. In some embodiments, the pitch of the openings O1 may be twice as large as the pitch of the mask layers 112a along the X direction.

Figure 7B:
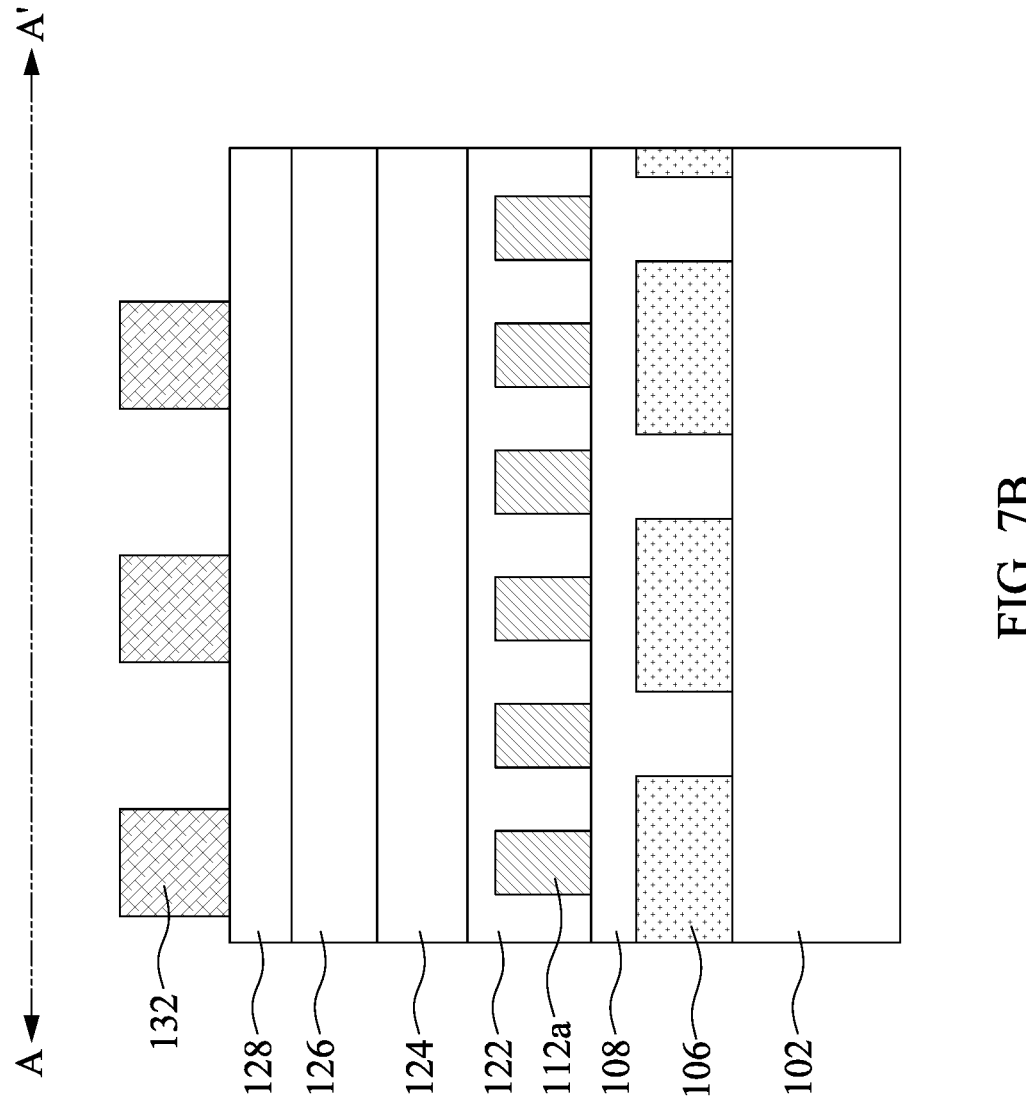
FIG. 7B is a cross-section along line A-A' of the semiconductor device as shown in FIG. 7A, in accordance with some embodiments of the present disclosure.
Figure 7B:
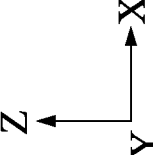
Figure 7C:
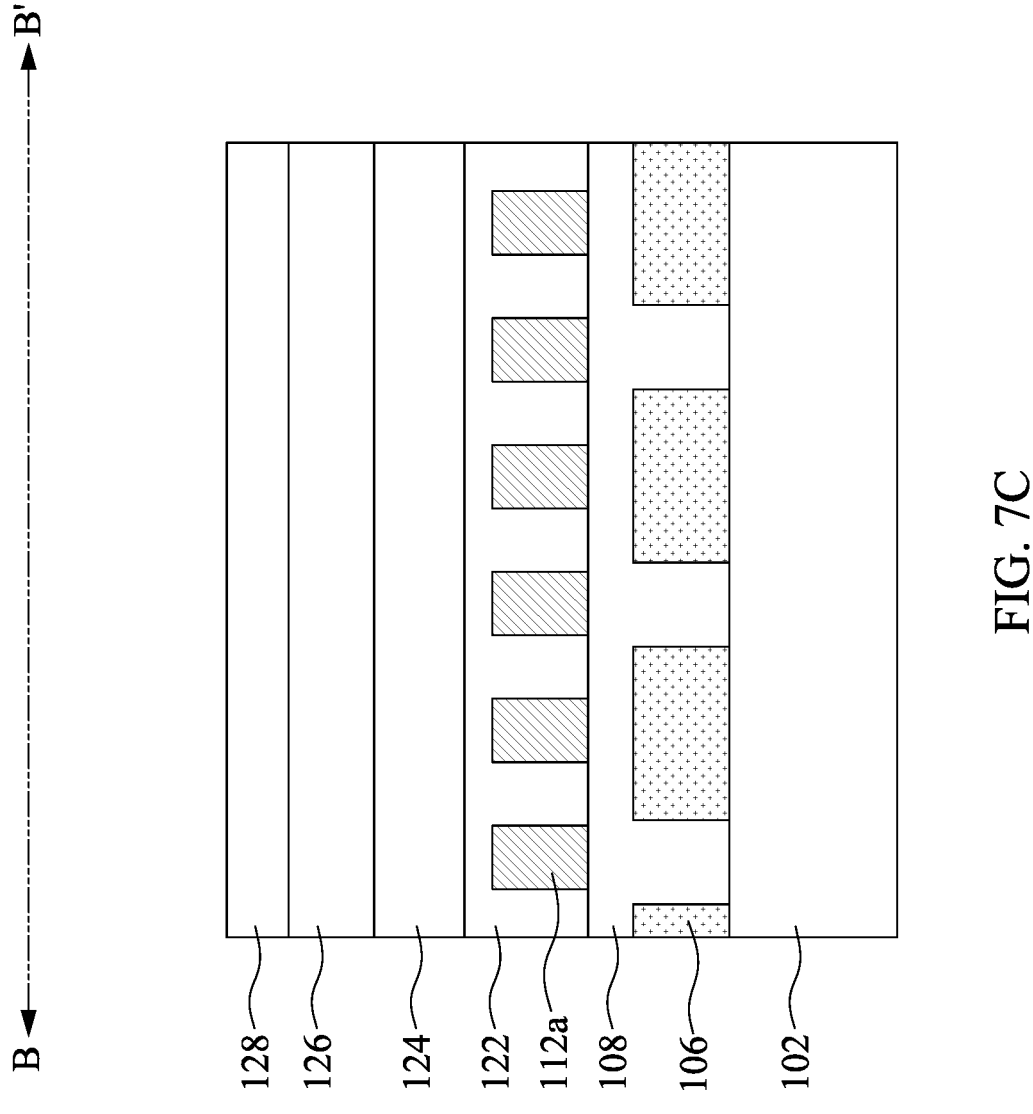
FIG. 7C is a cross-section along line B-B' of the semiconductor device as shown in FIG. 7A, in accordance with some embodiments of the present disclosure.

Referring to FIG. 7A, FIG. 7B, and FIG. 7C, a plurality of islands 132 may be formed within the openings O1 of the photosensitive layer 130. In some embodiments, the island 132 may include silicon oxide, silicon oxycarbide, silicon carbide, silicon nitride, silicon carbonitride, silicon oxynitride, aluminum oxide, aluminum oxynitride, or other suitable materials. The island 132 may be formed by CVD, ALD, PVD, LPCVD, PECVD, or other suitable processes.

In some embodiments, a dielectric material may be deposited to cover the photosensitive layer 130, and then a polishing process (e.g., a chemical mechanical polishing (CMP) process) may be performed to remove an upper portion of the dielectric material until the photosensitive layer 130 is exposed, and then the photosensitive layer 130 may be removed. In some embodiments, the island 132 may include a circular profile, an elliptical profile, or other suitable profiles. In some embodiments, the pitch of the islands 132 may be twice as large as the pitch of the mask layers 112a.

Figure 8B:
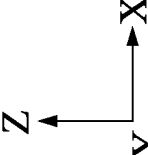
FIG. 8B is a cross-section along line A-A' of the semiconductor device as shown in FIG. 8A, in accordance with some embodiments of the present disclosure.

Referring to FIG. 8A, FIG. 8B, and FIG. 8C, an opening pattern definition layer 134 may be formed. In some embodiments, the opening pattern definition layer 134 may be formed on the lateral surface (not annotated) of the islands 132. In some embodiments, the opening pattern definition layer 134 may include silicon nitride, silicon oxycarbide, silicon carbide, silicon oxide, silicon carbonitride, silicon oxynitride, aluminum oxide, aluminum oxynitride, or other suitable materials. The opening pattern definition layer 134 may be formed by ALD, CVD, PVD, LPCVD, PECVD, or other suitable processes.

The opening pattern definition layer 134 may define a plurality of openings O2. In some embodiments, the profile of the opening O2 may be different that of the opening O1. Although FIG. 8A illustrates that the opening O2 has an irregular profile or a profile similar to a rhombic profile, the opening O2 may have other profiles, such as a circular profile or an elliptical profile, based on the deposition rate, temperature, or other process conditions configured to form the opening pattern definition layer 134. In some embodiments, the opening pattern definition layer 134 may include two or more materials formed by different stages to modify or control the profile of the opening pattern definition layer 134.

Figure 9B:
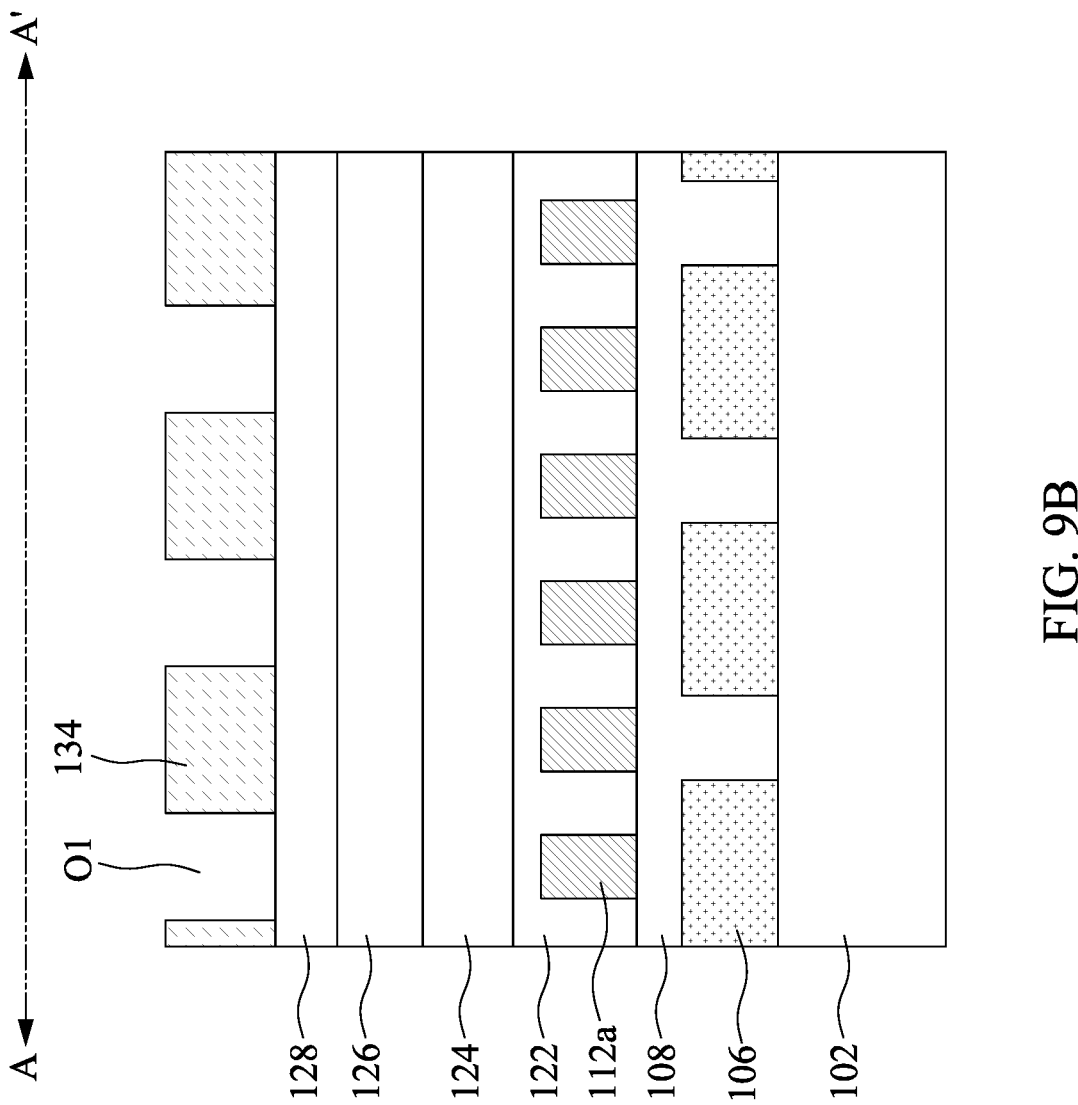
FIG. 9B is a cross-section along line A-A' of the semiconductor device as shown in FIG. 9A, in accordance with some embodiments of the present disclosure.
Figure 9C:
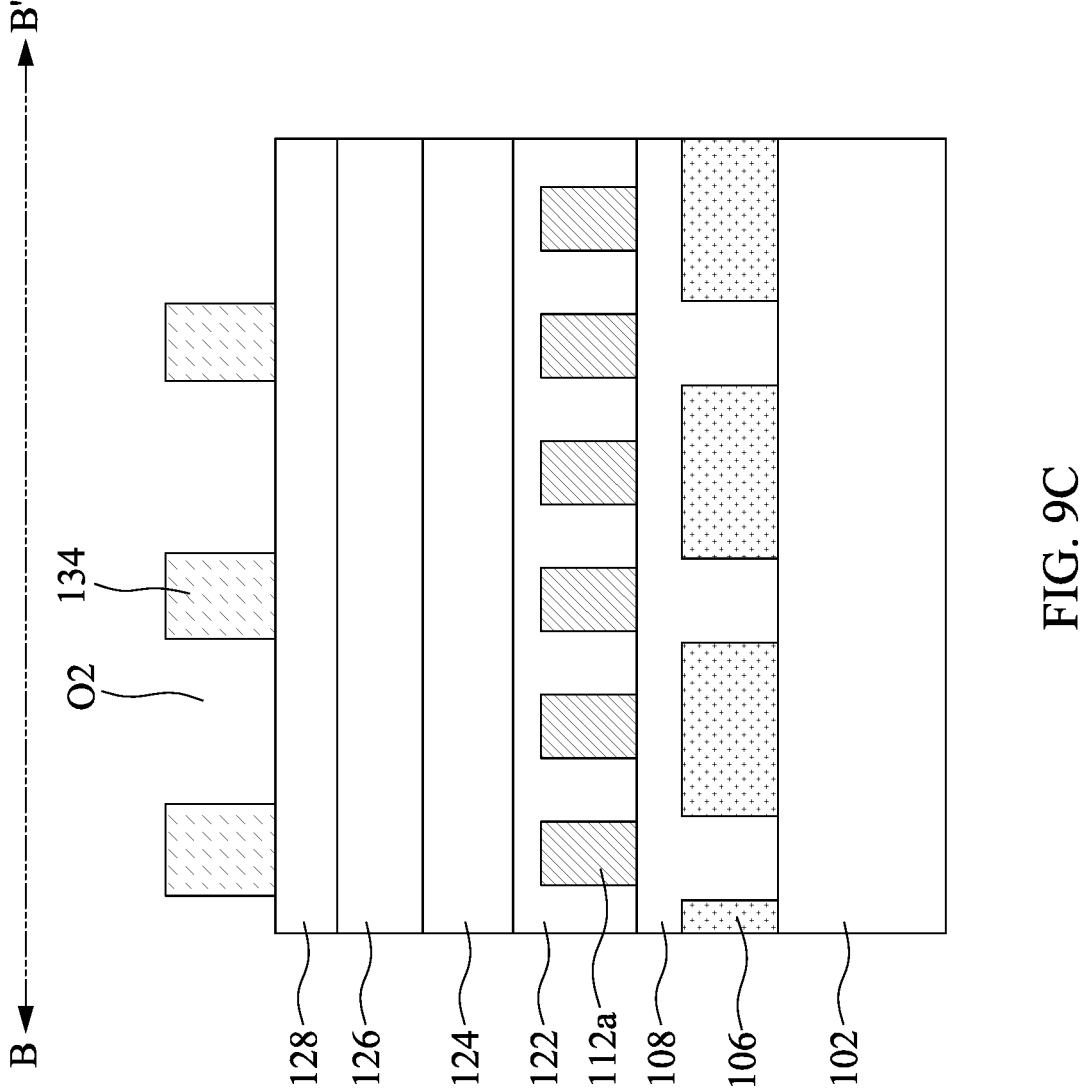
FIG. 9C is a cross-section along line B-B' of the semiconductor device as shown in FIG. 9A, in accordance with some embodiments of the present disclosure.

Referring to FIG. 9A, FIG. 9B, and FIG. 9C, the islands 132 may be removed. The openings O1 may be defined by the opening pattern definition layer 134. In some embodiments, the openings O1 and O2 may be arranged alternatively. One of the openings O1 may be surround by or abut four openings O2. In some embodiments, the dimension (e.g., area or aperture) of the opening O1 may be substantially the same as that of the opening O2.

In some embodiments, the pitch P2 of the openings O1 may substantially the same as the pitch P3 of the openings O2 along the X direction. In some embodiments, the pitch P2 of the openings O2 may be twice as large as the pitch P1 of the mask layers 112a along the X direction as shown in FIG. 4A. In some embodiments, the pitch P3 of the openings O2 may be twice as large as the pitch P1 of the mask layers 112a along the X direction as shown in FIG. 4A.

Figure 10A:
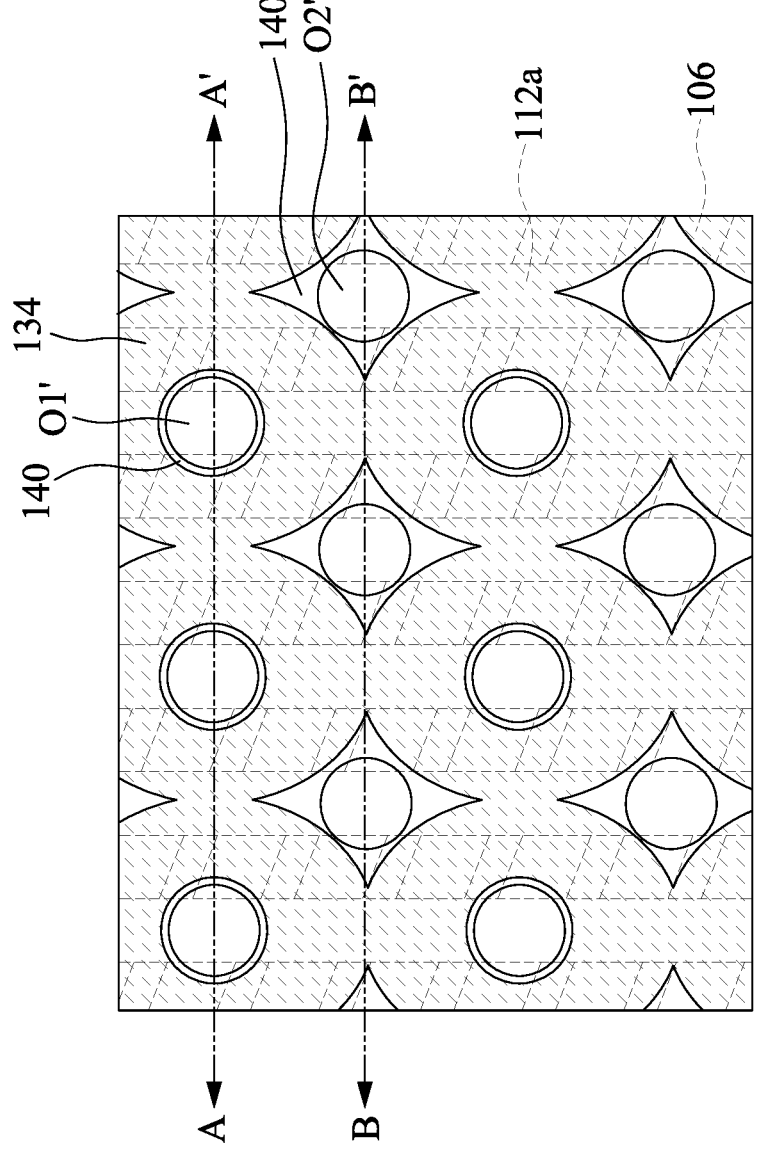
FIG. 10A illustrates one or more stages of an exemplary method for manufacturing a semiconductor device according to some embodiments of the present disclosure.
Figure 10A:
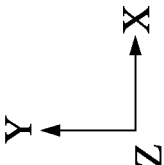
Figure 10B:
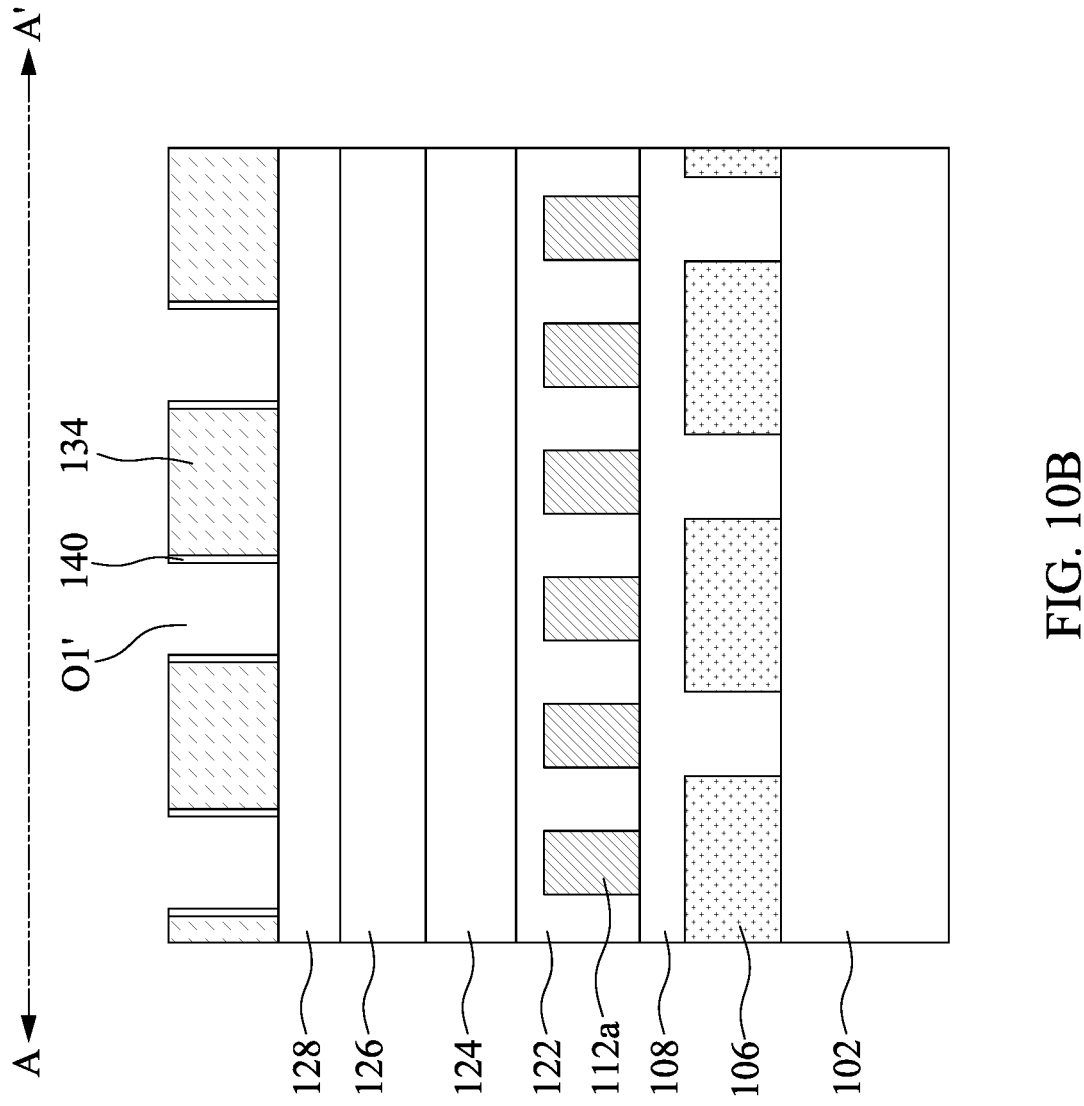
FIG. 10B is a cross-section along line A-A' of the semiconductor device as shown in FIG. 10A, in accordance with some embodiments of the present disclosure.
Figure 10C:
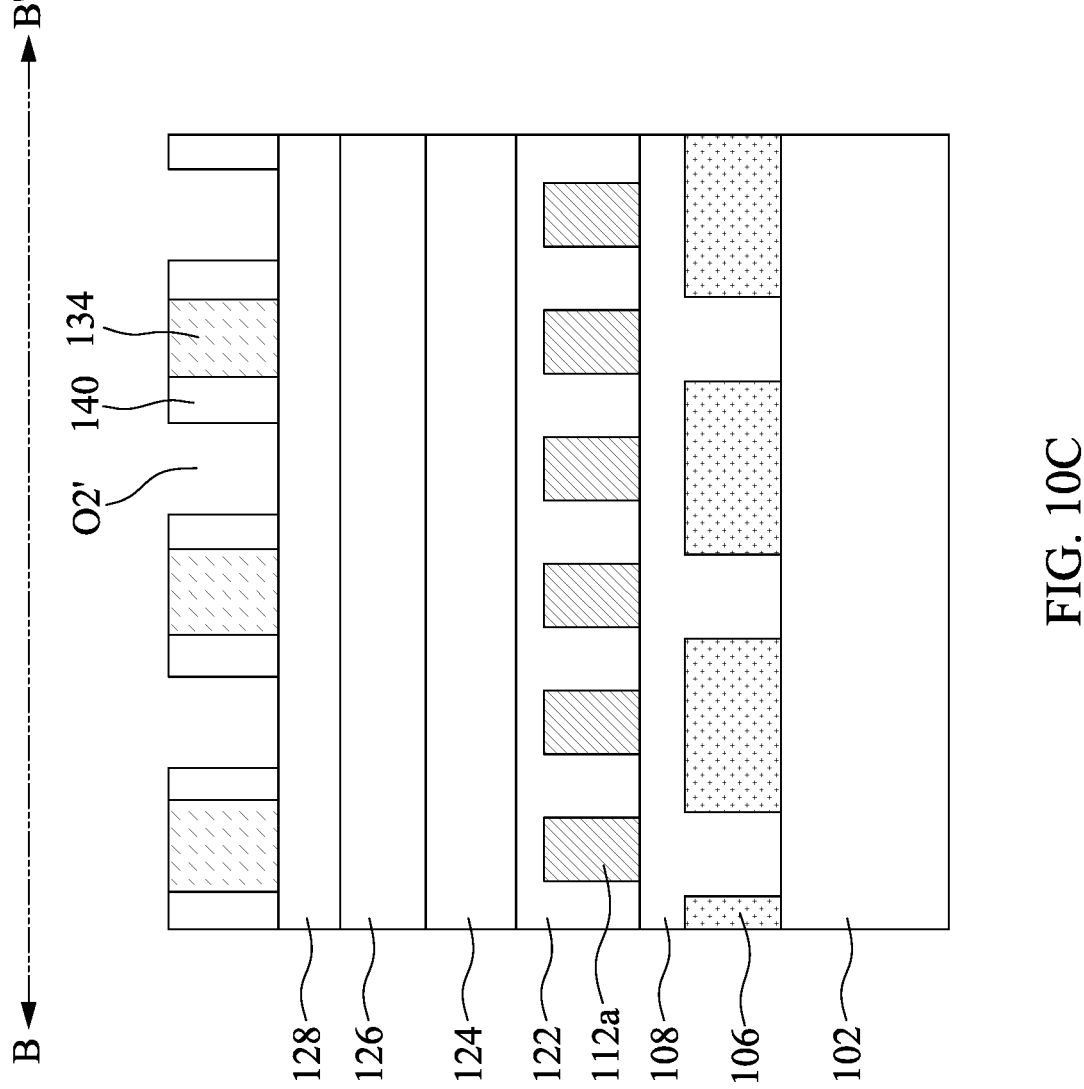
FIG. 10C is a cross-section along line B-B' of the semiconductor device as shown in FIG. 10A, in accordance with some embodiments of the present disclosure.

Referring to FIG. 10A, FIG. 10B, and FIG. 10C, an aperture modification layer 140 may be formed. In some embodiments, the aperture modification layer 140 may be formed on the lateral surface of the opening pattern definition layer 134. In some embodiments, the aperture modification layer 140 may be configured to define control or modify the dimension of the openings O1 and O2, and thus define openings O1' and O2' corresponding to the openings O1 and O2. In some embodiments, the dimension (e.g., area or aperture) of the opening O1' may be less than that of the opening O1. In some embodiments, the dimension (e.g., area or aperture) of the opening O2' may be less than that of the opening O2. The profile of the opening O2' may be modified or controlled by the aperture modification layer 140.

In some embodiments, the aperture modification layer 140 may include silicon oxide, silicon oxycarbide, silicon carbide, silicon nitride, silicon carbonitride, silicon oxynitride, aluminum oxide, aluminum oxynitride, or other suitable materials. The aperture modification layer 140 may be formed by CVD, ALD, PVD, LPCVD, PECVD, or other suitable processes. The formation of the aperture modification layer 140 may be optional. In other embodiments, the formation of the aperture modification layer 140 may be omitted.

Figure 11A:
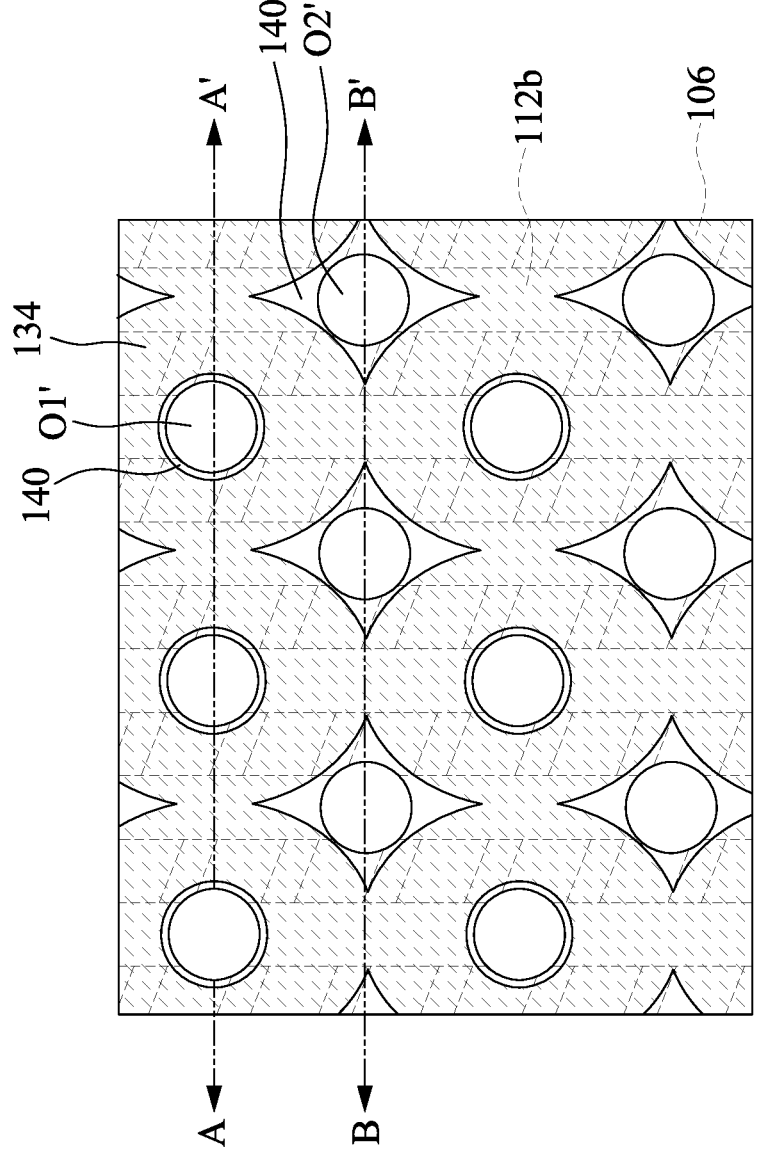
FIG. 11A illustrates one or more stages of an exemplary method for manufacturing a semiconductor device according to some embodiments of the present disclosure.
Figure 11A:
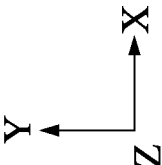
Figure 11B:
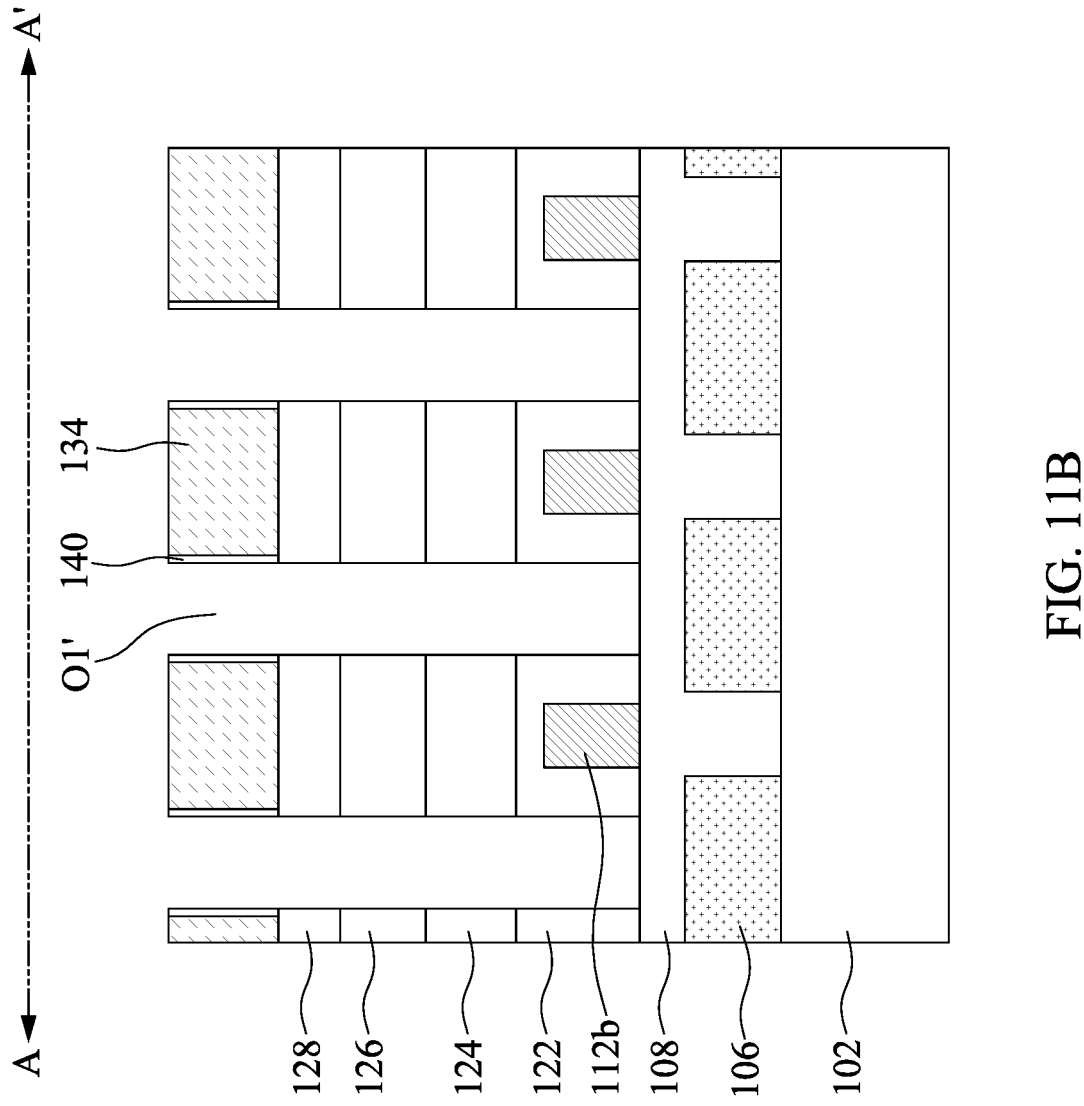
FIG. 11B is a cross-section along line A-A' of the semiconductor device as shown in FIG. 11A, in accordance with some embodiments of the present disclosure.
Figure 11C:
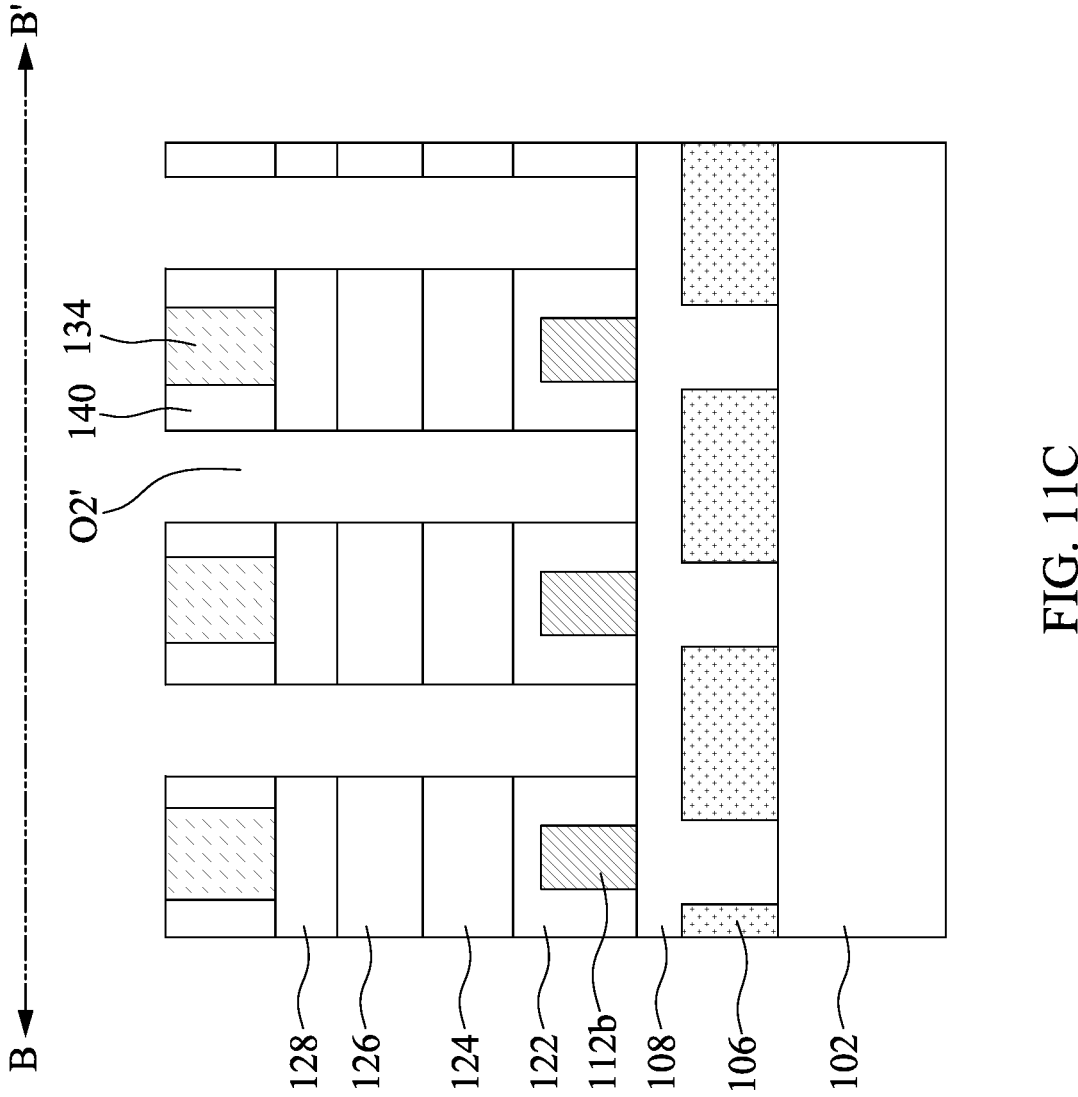
FIG. 11C is a cross-section along line B-B' of the semiconductor device as shown in FIG. 11A, in accordance with some embodiments of the present disclosure.

Referring to FIG. 11A, FIG. 11B, and FIG. 11C, an etching process, such as a dry etching process or a reactive ion etching (RIE) process, may be performed. The opening pattern definition layer 134 and the aperture modification layer 140 may collectively function as a hard mask, and a portion of the mask layers 112a, the underlayer 122, the dielectric layer 124, the dielectric layer 126, and the dielectric layer 128 may be partially etched. In some embodiments, the mask layers 112a exposed by the openings O1' (or opening O1) may be removed. In some embodiments, the mask layers 112a exposed by the openings O2' (or opening O2) may be removed. As a result, a cut pattern 112b may be defined.

Referring to FIG. 12A, FIG. 12B, and FIG. 12C, the underlayer 122, the dielectric layer 124, the dielectric layer 126, the dielectric layer 128, opening pattern definition layer 134, and aperture modification layer 140 may be removed to expose the cut pattern 122b. As shown in FIG. 12A, each of segments of the cut pattern 122b may extend along the Y-direction. The lateral surfaces of the cut pattern 122b may have a concave profile from a top view. The cut pattern 122b may define gaps G1 and G2 corresponding to locations of the openings O1 and O2, respectively. In some embodiments, each of the segments of the cut pattern 122b may vertically overlap two mask layers 106. In some embodiments, a length of one of the gaps G1 and G2 along the Y-direction may be greater than the length of one of the mask layers 106 along the Y-direction. In some embodiments, the dimension of the gaps G1 and G2 may be determined by the aperture modification layer 140. In some embodiments, the dimension of the 2

Figure 13C:
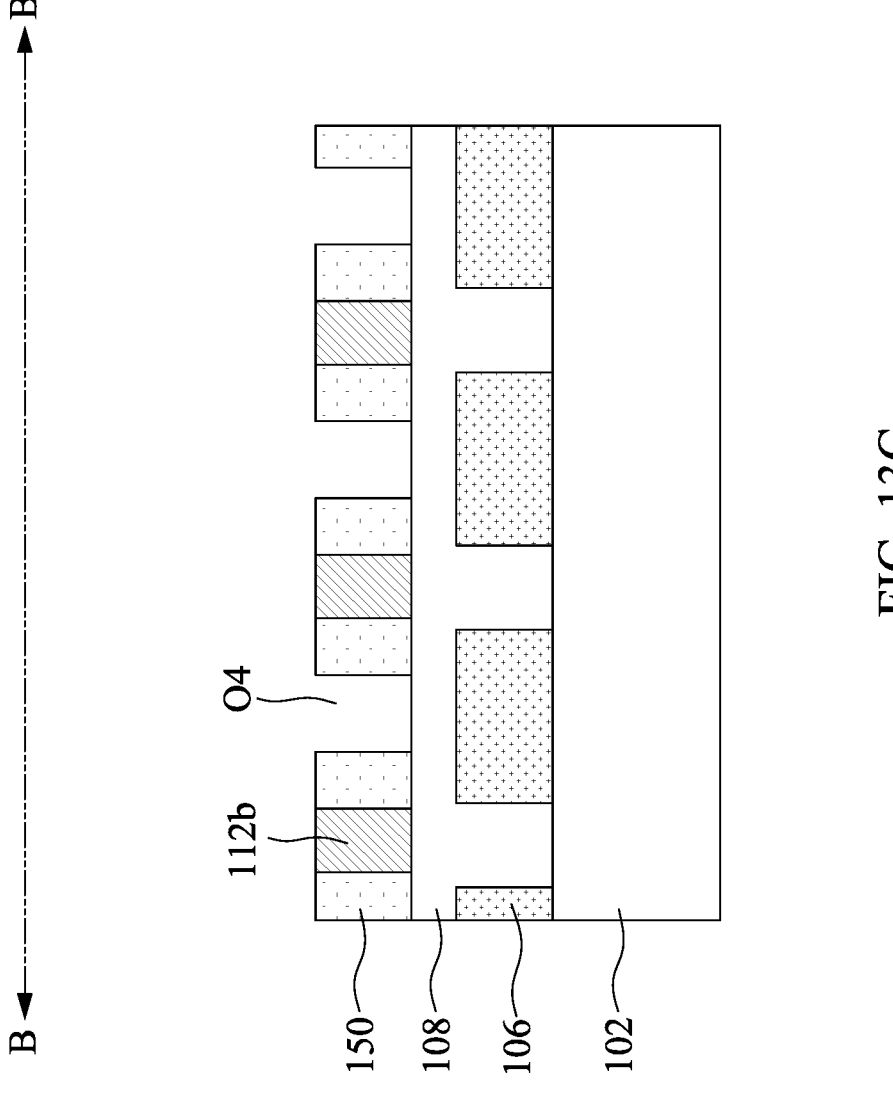
FIG. 13C is a cross-section along line B-B' of the semiconductor device as shown in FIG. 13A, in accordance with some embodiments of the present disclosure.

Referring to FIG. 13A, FIG. 13B, and FIG. 13C, an aperture modification layer 150 may be formed to define openings O3 and O4. In some embodiments, the aperture modification layer 150 may be formed on the lateral surface of the cut pattern 122b. In some embodiments, the aperture modification layer 150 may include silicon oxide, silicon oxycarbide, silicon carbide, silicon nitride, silicon carbonitride, silicon oxynitride, aluminum oxide, aluminum oxynitride, or other suitable materials. The aperture modification layer 150 may be formed by ALD, CVD, PVD, LPCVD, PECVD, or other suitable processes.

In some embodiments, the aperture modification layer 150 may be configured to define, modify and/or control the dimensions of the openings O3 and O4 to define the active region of the substrate 102 more accurately. The locations of the openings O3 and O4 may correspond to those of the openings O1 and O2, respectively. In some embodiments, the opening O3 may have a circular profile, an elliptical profile or other suitable profiles. In some embodiments, the opening O4 may have a circular profile, an elliptical profile or other suitable profiles. In some embodiments, the dimension (e.g., area or aperture) of the opening O3 may be less than that of the opening O1. In some embodiments, the dimension (e.g., area or aperture) of the opening O4 may be less than that of the opening O2. In some embodiments, the aperture modification layer 150 may include two or more materials which are formed by different stages or process conditions.

Figure 14C:
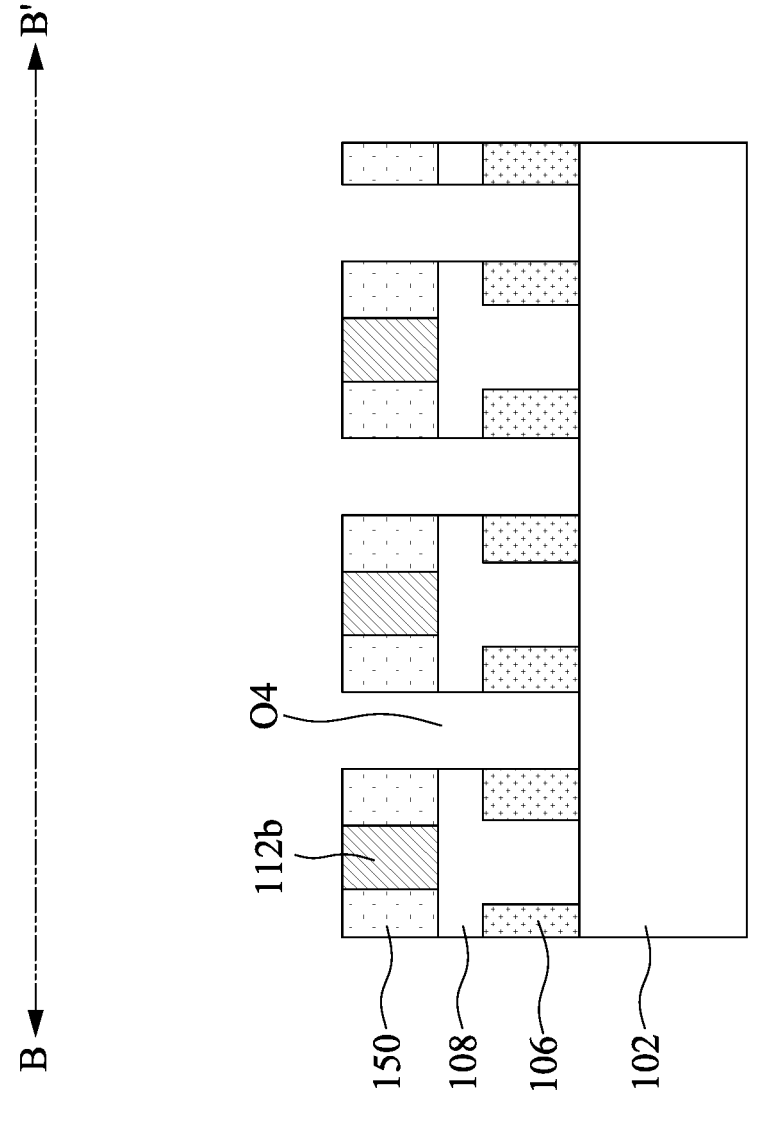
FIG. 14C is a cross-section along line B-B' of the semiconductor device as shown in FIG. 14A, in accordance with some embodiments of the present disclosure.
Figure 14C:
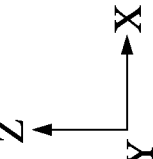

Referring to FIG. 14A, FIG. 14B, and FIG. 14C, an etching process, such as a dry etching process or RIE process, may be performed to etch a portion of the mask layer 106, the underlayer 108, and the aperture modification layer 150. The mask layers 106 may be patterned. In some embodiments, the cut pattern 112b and the aperture modification layer 150 may function as a hard mask to define the pattern of the etched mask layers 106. The mask layers 106 exposed by the cut pattern 112b and the aperture modification layer 150 may be removed.

Figure 15B:
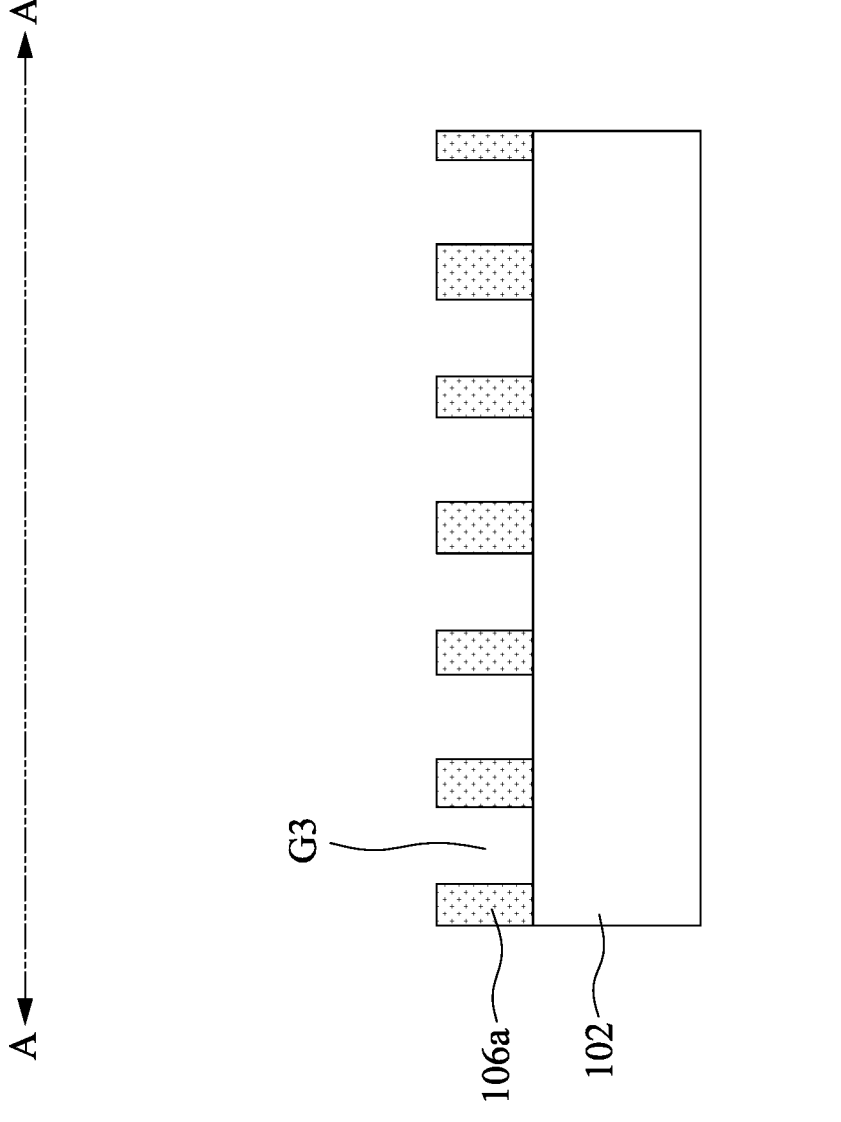
FIG. 15B is a cross-section along line A-A' of the semiconductor device as shown in FIG. 15A, in accordance with some embodiments of the present disclosure.
Figure 15C:
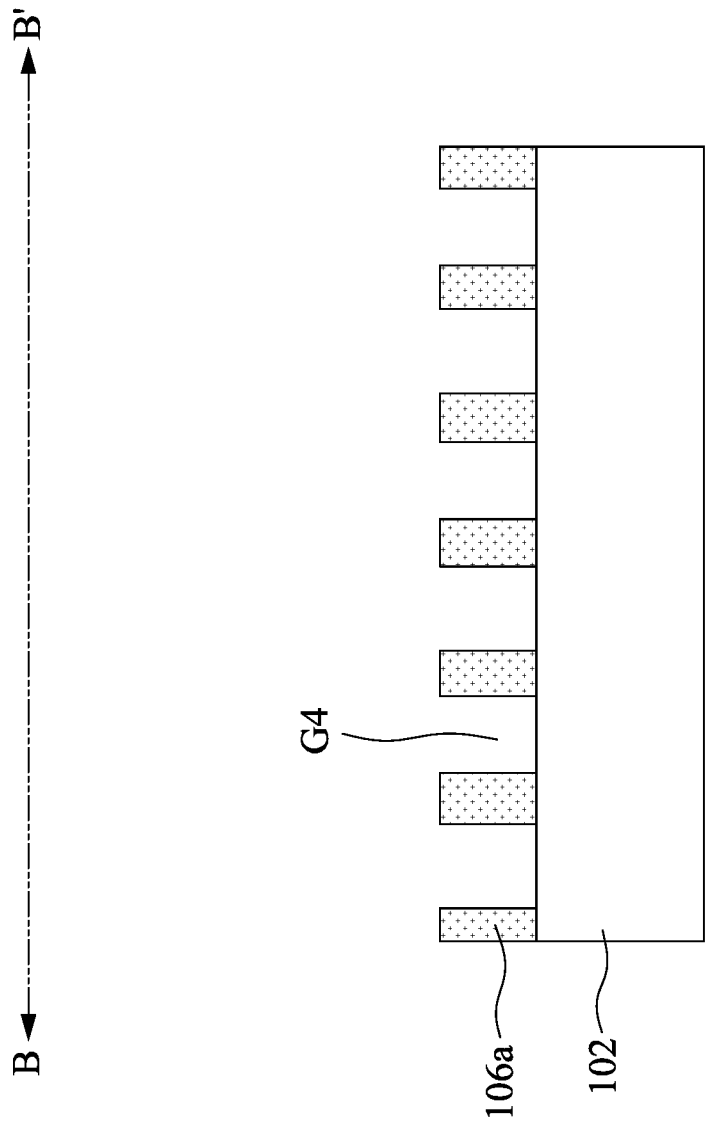
FIG. 15C is a cross-section along line B-B' of the semiconductor device as shown in FIG. 15A, in accordance with some embodiments of the present disclosure.

Referring to FIG. 15A, FIG. 15B, and FIG. 15C, the underlayer 108 may be removed. The cut pattern 112b may be removed. The aperture modification layer 150 may be removed. An active region definition pattern 106a may be defined. The active region definition pattern 106a may be configured to define a pattern of an active region of the substrate 102.

Each of the segments of the active region definition pattern 106a may extend along a direction nonparallel to the X-direction and the Y-direction. In some embodiments, the active region definition pattern 106a may define gaps G3 and G4. The locations of the gaps G3 and G4 may correspond to those of the gaps G1 and G2, respectively. In some embodiments, the dimension (e.g., length or width) of the gap G3 may be less than that of the gap G1. In some embodiments, the dimension (e.g., length or width) of the gap G4 may be less than that of the gap G2.

Referring to FIG. 16A and FIG. 16B, the substrate 102 may be patterned to define an active region 102a. The substrate 102 exposed by the active region definition pattern 106a may be etched to form a recess 102r recessed from an upper surface of the substrate 102. In some embodiments, each segments of the active region 102a may have a circular profile, an elliptical profile, or other suitable profiles. In some embodiments, each segments of the active region 102a may have a long axis substantially parallel to the mask layer 106 as shown in FIG. 1A.

Referring to FIG. 17A and FIG. 17B, the active region definition pattern 106a may be removed. The active region 102a of the substrate 102 may be exposed. As a result, a semiconductor device 100 may be produced.

In some embodiments, the semiconductor device 100 may be configured to form a memory device. The memory device may include, for example, a dynamic random access memory (DRAM) device, a one-time programming (OTP) memory device, a static random access memory (SRAM) device, or other suitable memory devices. In some embodiments, a DRAM may include, for example, a transistor, a capacitor, and other components. During a read operation, a word line may be asserted, turning on the transistor. The enabled transistor allows the voltage across the capacitor to be read by a detection amplifier through a bit line. During a write operation, the data to be written may be provided on the bit line when the word line is asserted.

For example, the recess 102r may be filled with an isolation material to separate each segments of the active region 102a. The word line, capacitors, and/or other elements may be formed on the active region 102a to produce a memory device.

It should be noted that the profile of an etched object may not inherit a profile of the mask layer because of etching rates are uneven because of a topography of a structure.

FIG. 18A and FIG. 18B are flowcharts illustrating a method 200 of manufacturing a semiconductor device, in accordance with some embodiments of the present disclosure.

Referring to FIG. 18A, the method 200 may begin with operation 202 in which a substrate is provided. A plurality of first mask layers are formed on the substrate.

The method 200 may continue with operation 204 in which a first dielectric layer is formed on the first mask layers. A photoresist pattern is formed on the first dielectric layer.

The method 200 may continue with operation 206 in which a pitch definition layer is formed on the lateral surface of the photoresist pattern.

The method 200 may continue with operation 208 in which the first dielectric layer is patterned to form a plurality of second mask layers. the first mask layer and the second mask layer may define an angle range from about 20° to about 35°.

The method 200 may continue with operation 210 in which a second dielectric layer is formed on the second mask layers. A photosensitive layer is formed on the second dielectric layer. The photosensitive layer defines a plurality of first openings overlapping the second mask layers.

The method 200 may continue with operation 212 in which islands may be formed within the first openings. The photosensitive layer may be removed.

Referring to FIG. 18B, the method 200 may continue with operation 214 in which an opening pattern definition layer may be formed to define a plurality of second openings. The profile of the second opening may be different from that of the first opening. The second openings and the first openings may be arranged alternatively.

The method 200 may continue with operation 216 in which a first aperture modification layer may be formed to reduce the dimensions of the first openings and the second openings. The profile of the first openings and the second openings may be modified. The formation of the first aperture modification layer may be optional.

The method 200 may continue with operation 218 in which the second mask layers may be patterned to form a cut pattern. The cut pattern defines gaps vertically overlapping the first mask layers.

The method 200 may continue with operation 220 in which a second aperture modification layer may be formed to form third openings and fourth openings. The locations of the third openings may correspond to the first opening. The locations of the fourth openings may correspond to the second opening. The dimension of the third opening may be less than the first opening. The dimension of the fourth opening may be less than the second opening.

The method 200 may continue with operation 222 in which the first mask layers may be patterned to form an active region definition pattern.

The method 200 may continue with operation 224 in which the substrate may be patterned to define an active region. As a result, a semiconductor device may be produced.

The method 200 is merely an example, and is not intended to limit the present disclosure beyond what is explicitly recited in the claims. Additional operations can be provided before, during, or after each operations of the method 200, and some operations described can be replaced, eliminated, or reordered for additional embodiments of the method. In some embodiments, the method 200 can include further operations not depicted in FIG. 18A and FIG. 18B. In some embodiments, the method 200 can include one or more operations depicted in FIG. 18A and FIG. 18B.

One aspect of the present disclosure provides a method of manufacturing a semiconductor device. The method includes: providing a substrate; forming a plurality of first mask layers over the substrate, wherein each of the first mask layers extends along a first direction; forming a plurality of second mask layers over the substrate, wherein each of the second mask layers extends along a second direction different from the first direction; patterning the plurality of second mask layers to form a cut pattern; forming a first aperture modification layer on the cut pattern to define a plurality of first openings overlapping the plurality of first mask layers along a third direction substantially orthogonal to the first direction and the second direction; patterning the plurality of first mask layers to form an active region definition pattern; and patterning the substrate to define an active region by the active region definition pattern.

Another aspect of the present disclosure provides a method of manufacturing a semiconductor device. The method includes: providing a substrate; forming a plurality of first mask layers over the substrate, wherein each of the first mask layers extends along a first direction; forming a plurality of second mask layers over the substrate, wherein each of the second mask layers extends along a second direction different from the first direction; forming a plurality of islands over the plurality of second mask layers; and forming an opening pattern definition layer on the plurality of islands to define a plurality of first openings; removing the plurality of islands to form a plurality of second openings; and forming a cut pattern by removing the plurality of second mask layers not overlapping the second openings and the third openings along a third direction orthogonal to the first direction and the second direction; patterning the plurality of first mask layers by the cut pattern; and patterning the substrate to define an active region.

Another aspect of the present disclosure provides a method for manufacturing a semiconductor device. The method includes: providing a substrate; forming a plurality of first mask layers over the substrate, wherein each of the first mask layers extends along a first direction; forming a plurality of second mask layers over the substrate, wherein each of the second mask layers extends along a second direction different from the first direction; forming an opening pattern definition layer over the plurality of second mask layers to define a plurality of openings overlapping the plurality of second mask layers along a third direction substantially orthogonal to the first direction and the second direction; forming a first aperture modification layer to modify dimensions of the plurality of openings; patterning the plurality of second mask layers to form a cut pattern by removing the plurality of second mask layers overlapping the plurality of openings; patterning the plurality of first mask layers to form an active region definition pattern; and patterning the substrate to define an active region by the active region definition pattern.

The embodiments of the present disclosure provide a method of manufacturing a semiconductor device. In this embodiment, an aperture modification layer may be formed to reduce the dimension of an opening whose aperture is defined by a lithography process. Since an aperture defined by a lithography process cannot be reduced to have a desired dimension because of equipment limitation, an aperture modification layer may be formed to reduce the dimension of the opening. As a result, the semiconductor device can have an active region with a smaller pitch, which facilitates in forming more devices in a unit area.

Although the present disclosure and its advantages have been described in detail, it should be understood that various changes, substitutions and alterations may be made herein without departing from the spirit and scope of the disclosure as defined by the appended claims. For example, many of the processes discussed above may be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

What is claimed is:

1. A method of manufacturing a semiconductor device, comprising:
   providing a substrate;
   forming a plurality of first mask layers over the substrate, wherein each of the first mask layers extends along a first direction;
   forming a plurality of second mask layers over the substrate, wherein each of the second mask layers extends along a second direction different from the first direction;
   forming a plurality of islands over the plurality of second mask layers;
   forming an opening pattern definition layer on the plurality of islands to define a plurality of first openings;
   removing the plurality of islands to form a plurality of second openings;
   forming a cut pattern by removing the plurality of second mask layers overlapping the second openings and the first openings along a third direction orthogonal to the first direction and the second direction;
   patterning the plurality of first mask layers by the cut pattern; and
   patterning the substrate to define an active region;
   wherein the opening pattern definition layer is formed by an atomic deposition layer process;
   wherein forming the plurality of second mask layers comprises:
   forming a dielectric layer over the plurality of first mask layers;
   forming a photoresist pattern over the dielectric layer;
   forming a pitch definition layer on the plurality of photoresist pattern; and
   patterning the dielectric layer by removing the dielectric layer not overlapping the pitch definition layer along the third direction.

2. The method of claim 1, wherein an angle defined by the first direction and the second direction ranges from about 20° to about 35°.

3. The method of claim 1, further comprising:
   forming a first aperture modification layer on the cut pattern to define a plurality of third openings overlapping the plurality of first mask layers along the third direction.

4. The method of claim 3, wherein patterning the plurality of first mask layers comprises removing the plurality of first mask layers overlapping the plurality of third openings along the third direction.

5. The method of claim 3, wherein the first aperture modification layer is formed by an atomic deposition layer process.

6. The method of claim 3, wherein the first aperture modification layer comprises oxide, nitride, oxynitride, or a combination thereof.

7. The method of claim 1, further comprising:
   forming a second aperture modification layer on the opening pattern definition layer to modify dimensions of the plurality of first openings and the plurality of second openings.

8. The method of claim 1, wherein the plurality of second openings and the plurality of first openings are alternatively arranged.

9. The method of claim 1, wherein a pitch of the plurality of second openings is substantially equal to a pitch of the plurality of first openings.

10. The method of claim 1, wherein a pitch of the plurality of second mask layers is defined by the pitch definition layer.

* * * * *